US008603642B2

(12) United States Patent
Hatwar et al.

(10) Patent No.: US 8,603,642 B2
(45) Date of Patent: Dec. 10, 2013

(54) INTERNAL CONNECTOR FOR ORGANIC ELECTRONIC DEVICES

(75) Inventors: Tukaram K. Hatwar, Penfield, NY (US); Jeffrey P. Spindler, Rochester, NY (US); Denis Y. Kondakov, Kendall, NY (US); Steven A. Van Slyke, Pittsford, NY (US); Sven Z. Murano, Dresden (DE); Gufeng He, Dreseden (DE)

(73) Assignee: Global OLED Technology LLC, Wilmington, DE (US)

( * ) Notice: Subject to any disclaimer, the term of this patent is extended or adjusted under 35 U.S.C. 154(b) by 945 days.

(21) Appl. No.: 12/465,235

(22) Filed: May 13, 2009

(65) Prior Publication Data

US 2010/0288362 A1   Nov. 18, 2010

(51) Int. Cl.
*B32B 15/01* (2006.01)
*B32B 9/00* (2006.01)

(52) U.S. Cl.
USPC .......................................... 428/617; 428/690

(58) Field of Classification Search
USPC ............................. 428/917, 690, 17; 313/506
See application file for complete search history.

(56) References Cited

U.S. PATENT DOCUMENTS

| 6,337,492 | B1 | 1/2002 | Jones et al. | |
|---|---|---|---|---|
| 6,717,358 | B1 | 4/2004 | Liao et al. | |
| 7,075,231 | B1 | 7/2006 | Liao et al. | |
| 7,273,663 | B2 | 9/2007 | Liao et al. | |
| 7,494,722 | B2 * | 2/2009 | Liao et al. | 428/690 |
| 2003/0127967 | A1 | 7/2003 | Tsutsui et al. | |
| 2006/0240278 | A1 | 10/2006 | Hatwar et al. | |
| 2006/0263629 | A1 * | 11/2006 | Aziz et al. | 428/690 |
| 2007/0141396 | A1 | 6/2007 | Chun et al. | |
| 2008/0171226 | A1 | 7/2008 | Noh et al. | |

FOREIGN PATENT DOCUMENTS

| EP | 1 564 826 A1 | 10/2004 |
|---|---|---|
| WO | 2007/027441 | 3/2007 |
| WO | 2007/071450 | 6/2007 |

\* cited by examiner

*Primary Examiner* — Ling Choi
*Assistant Examiner* — Monique Peets
(74) *Attorney, Agent, or Firm* — McKenna Long & Aldridge, LLP

(57) ABSTRACT

The invention provides an electronic device including an anode and a cathode, between which there are at least two organic phototransducing units where the units are separated by an intermediate connecting region which comprises in sequence: an organic p-type layer, an intermediate layer in direct contact with the organic p-type layer and including a compound that has a LUMO more negative than −3.0 eV and is different from the organic compound in the organic p-type layer, and an n-type doped organic layer in direct contact with the intermediate layer and including an electron transport material as a host and an organic n-dopant with a HOMO less negative than −4.5 eV. In one embodiment, the electronic device is a tandem OLED.

18 Claims, 3 Drawing Sheets

INTERNAL CONNECTOR FOR ORGANIC ELECTRONIC DEVICES

FIELD OF THE INVENTION

This invention relates to an organic electronic device with at least two phototransducing (charge transporting) units separated by an internal connector region formed from a p-type organic layer, an intermediate layer and a n-type doped organic layer.

BACKGROUND OF THE INVENTION

Electronic devices such as solar cells, field-effect transistors and OLEDs can be composed of organic materials disposed in stacked layers. Devices of this type may require two separate charge transporting regions or units that must be physically separated from each other while maintaining good electric and physical contact between them so that current can flow efficiently through both regions. This connecting region can be composed of multiple layers with different electronic properties so that current can pass with reduced resistance. The layer(s) that make up the connecting region can have various names such as charge generation layer(s) or recombination layer(s). One common arrangement of this type is known as a 'pn' also 'pin' or 'p-i-n' junction. This is typically composed of a layer with p-type (hole generating) and a layer with n-type (electron generating) properties. In this way, a region with high conductivity is created.

Organic electronic devices with these kinds of internal connecting regions are known. In particular, U.S. Pat. No. 6,717,358 discloses tandem OLEDs with two electroluminescent units where the connecting region is formed from a n-type doped layer, interfacial layer, p-type doped layer arrangement where the interfacial layer must be transparent and formed from a semi-conducting material with bandgap <4.0 eV. Similarly, U.S. Pat. No. 7,273,663 discloses OLEDs with two electroluminescent units where the connecting region is formed from a n-type doped layer, metal compound layer, p-type doped layer arrangement where the metal compound can be a metal oxide, sulfide, selenide or nitride. US2006/0263629 discloses OLEDs with two electroluminescent units separated by an "intermediate electrode" of an electron-injection layer, mixed metal-organic material layer, hole-injecting layer arrangement. The organic material in the mixed layer may include phthalocyanines among other materials.

U.S. Pat. No. 7,494,722 discloses tandem OLEDs where the intermediate connector is formed from a n-doped organic layer and an electron-accepting layer containing a compound with a reduction potential greater than −0.5 eV (vs. SCE). The material in the electron accepting layer may be a hexaazatriphenylene or fluorinated derivatives of tetracyanobenzoquinonedimethane. There may be an interfacial layer between the n-doped organic layer and the electron accepting layer. These same devices have also been disclosed in Liao et al, Advanced Materials, 20(2), 324-329 (2008).

WO2007/071450 discloses electronic devices with p-n junctions where the n-type molecular dopant has a redox potential <1.5 eV and the p-type molecular dopant has a redox potential >0 eV.

Disclosures of electronic devices which use phthalocyanines as a connecting layer between two charge transporting units include EP 1564826 and U.S. Pat. No. 6,337,492.

Additional examples of tandem OLEDs that include at least two electroluminescent units with an intermediate connector include U.S. Pat. No. 6,872,472, US2003/127967, U.S. Pat. No. 7,075,231, U.S. Pat. No. 7,494,722, WO2007/027441 and US2008/0171226.

Notwithstanding all of these developments, there are continuing needs for improvements. For EL devices that produce light (for example, an OLED) or convert light into current (for example, a solar cell), there remains a need to maintain or increase high luminance or photoelectric conversion efficiencies and provide long lifetimes. For OLEDs, lower device drive voltages and hence lower power consumption as well as good color purity is also desirable.

SUMMARY OF THE INVENTION

The invention provides an electronic device comprising an anode and a cathode, between which there are at least two organic phototransducing units where the units are separated by an intermediate connecting region which comprises:

a) an organic p-type layer;

b) an intermediate layer in direct contact with the organic p-type layer and including a compound that has a LUMO more negative than −3.0 eV and is different from the organic compound in the organic p-type layer; and c) an n-type doped organic layer in direct contact with the intermediate layer and including an electron transport material as a host and an organic n-dopant with an effective HOMO less negative than −4.5 eV.

In one embodiment, the organic electronic device is a tandem OLED where two electroluminescent units which emit light are separated by the intermediate connecting region. In another embodiment, the organic electronic device is a solar cell where two photoactive units that convert light into electricity are separated by the intermediate connecting region.

Devices of the invention provide improvement in features such as drive voltage, voltage stability during operation, efficiency and long device lifetime. Such junctions may be introduced in all kinds of organic semiconductor devices such as organic TFTs, solar cells or alike.

Figure 1:
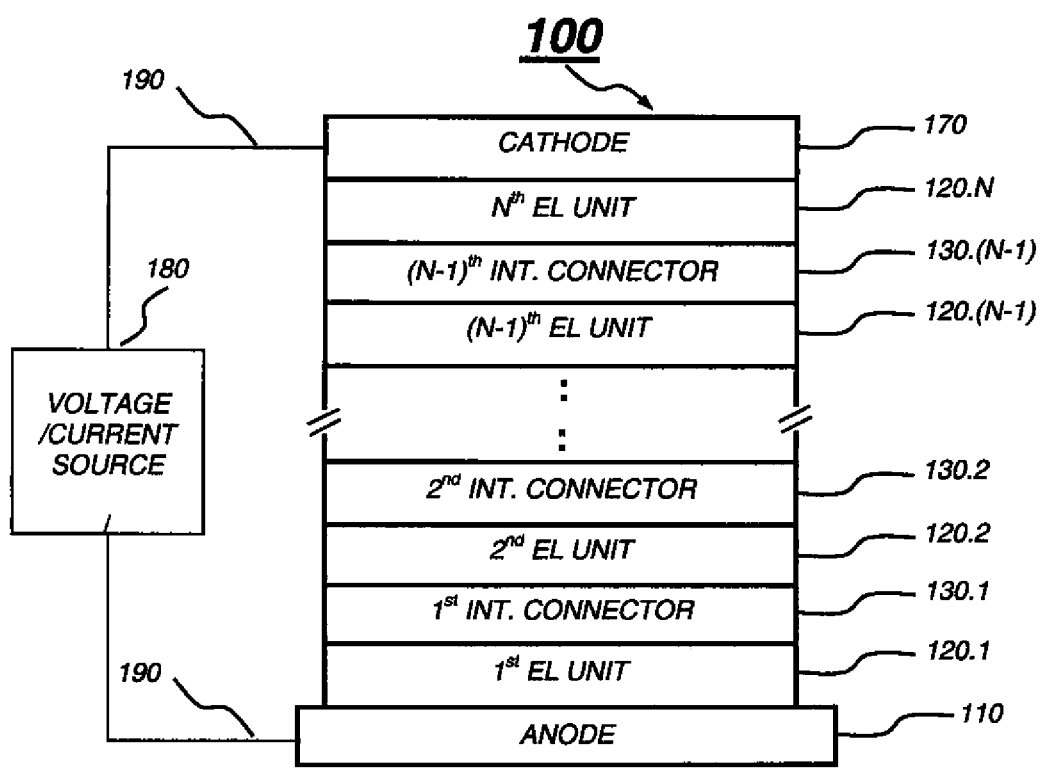
FIG. 1 shows a schematic illustration of a tandem OLED device in which the present invention can be incorporated.

It will be understood that the figures are not to scale since the individual layers are too thin and the thickness differences of various layers are too great to permit depiction to scale.

DETAILED DESCRIPTION OF THE INVENTION

The invention is generally as described above. The devices of the invention contain an intermediate connecting region (ICR) which has a p-type organic layer (p-DOL) in direct contact with an intermediate layer (IL) which in turn is in direct contact with an n-doped organic layer (n-DOL). Both the IL and n-doped layers contain specific kinds of materials.

A phototransducing unit is a layer or a series of layers which converts light into electricity such as a photoactive layer in a solar cell, or it may also be a unit which converts electricity in light such as an emission layer in an OLED. Phototransducting units are also efficient charge-transporting units.

Typically, an n-type doped layer has at least two materials; an organic n-type host as a major component which can accept and transport electrons and a dopant as a minor component which can easily supply electrons. This layer has semiconducting properties after doping, and the electrical current through this layer is substantially carried by electrons. The conductivity is provided as a result of electron transfer from HOMO of the dopant to the LUMO of the host material (electron transport material). The n-doping therefore increases considerably the charge carrier density of the host. The conductivity, which is initially very low, is increased by generating charge carriers in the host material. Doping in this case leads to an increase in the conductivity of charge transport layers, as a result of which ohmic losses in charge transport are reduced, and to an improved transfer of the charge carriers between the contacts and the organic layer.

The inventive N-DOL in the ICR contains an electron transporting material as a host and an organic material with an effective HOMO less negative than −4.5 eV as an n-dopant. Strongly reducing species such as alkali metals, alkaline earth metals or sources thereof have been commonly used as n-dopants. In particular, lithium is often used as an n-dopant. However, diffusion of the metal into other layers is known to decrease stability. Moreover, vapor deposition of metals such as lithium can be problematic during manufacturing. One of the advantages of this invention is that using an organic dopant avoids the use of reducing metals and problems associated with them.

The n-dopant is an organic molecule or a neutral radical or combination thereof that is a strong reducing agent with an effective HOMO energy level less negative than −4.5 eV in the n-DOL. It is preferred that the effective HOMO be less negative than −3.5 eV, preferably less negative than −3.0 eV, more preferably less negative than −2.6 eV. The organic n-dopant can be created by a precursor during the layer forming (deposition) process or during a subsequent process of layer formation (see DE 10307125.3).

The effective HOMO of an n-dopant corresponds to the reducing power of the active reducing species in the device itself. In the case of an n-dopant that is unaffected by the fabrication process and requires no subsequent activation, its effective HOMO is the same as that as measured directly. However, in some instances, a precursor to the n-dopant is used so the HOMO as measured for the precursor is not representative of the actual species present in the n-DOL. In some cases, the precursor must be further activated once the layer is formed to form the active reducing species. In this case, the effective HOMO of the n-dopant should be determined using in-film measurements using the following procedure.

A homogenous n-doped layer is prepared with an electron transporting host material co-evaporated with the n-dopant or precursor using vacuum thermal evaporation methods. The layer is deposited over a substrate which contains electrodes with defined patterns for conductivity measurements (e.g. 2-point or 4-point measurements). For precursor dopants, it can be necessary to activate the precursor before measuring the conductivity. One way to perform the activation is to shine light on the substrate during the evaporation. The light is turned off for the conductivity measurement.

A series of samples are prepared using the same procedure with the same dopant but using different host materials. The different host materials are chosen to form a stepped LUMO series as indicated in the table below:

Stepped LUMO Series for Effective HOMO Determination

| Host Material | LUMO level (eV) |
| --- | --- |
| Bphen | −2.33 |
| Balq | −2.41 |
| Alq3 | −2.43 |
| 2,9-di(naphthalen-1-yl)-4,7-diphenyl-1,10-phenanthroline | −2.5 |
| 2,4,7,9-tetraphenylpyrido[3,2-h]quinazoline | −2.65 |
| Zinc tetraphenylporphyrin | −2.89 |
| Zinc Phthalocyanine | −3.39 |

The conductivity of all the samples is measured from the one with the ETM with more negative LUMO up to the one with less negative LUMO. The effective HOMO is equal to the LUMO of the last matrix which shows conductivity after doping of at least $10^{-7}$ S/cm. Once a narrow range of values for the effective HOMO is found, it can be further narrowed by consecutive sets of experiments using ETMs with closer LUMO levels. When the n-dopant is unaffected by the fabrication process, its effective HOMO is the same as that measured directly.

For non-precursor materials, HOMO and LUMO energy levels can be directly determined from redox properties of molecules, which can be measured by well-known literature procedures, such as cyclic voltammetry (CV) and Osteryoung square-wave voltammetry (SWV). For a review of electrochemical measurements, see J. O. Bockris and A. K. N. Reddy, *Modern Electrochemistry*, Plenum Press, New York; and A. J. Bard and L. R. Faulkner, *Electrochemical Methods*, John Wiley & Sons, New York, and references cited therein.

If for some reason, the LUMOs or HOMOs cannot be measured directly, a calculated energy level can be used. Typical calculations are carried out by using the B3LYP method as implemented in the Gaussian 98 (Gaussian, Inc., Pittsburgh, Pa.) computer program. The basis set for use with the B3LYP method is defined as follows: MIDI! for all atoms for which MIDI! is defined, 6-31G* for all atoms defined in 6-31 G* but not in MIDI!, and either the LACV3P or the LANL2DZ basis set and pseudopotential for atoms not defined in MIDI! or 6-31G*, with LACV3P being the preferred method. For any remaining atoms, any published basis set and pseudopotential can be used. MIDI!, 6-31G* and LANL2DZ are used as implemented in the Gaussian98 computer code and LACV3P is used as implemented in the Jaguar 4.1 (Schrodinger, Inc., Portland Oreg.) computer code.

The molar mass of the organic n-dopant is in a range between 100 and 2000 g/mol, preferably in a range from 200 and 1000 g/mol.

For the purposes of this invention, an organic n-dopant is one that mainly comprises an organic conjugated system which can comprise heteroatoms. The organic n-dopant also does not release metal ions in the organic n-type material as the main doping mechanism. A "pure-organic" n-dopant is defined as a n-dopant which contains no metals, metallic substances or metal ions at all. Reducing species that are metals with organic ligands are not the organic n-dopant of this invention.

Suitable examples of organic n-dopants can be found in EP1837927, US20070252140 and Ludvik et al, J Electroanalytical Chem and Interfacial Electrochem., 180(1-2) 141-156 (1984). Preferred organic n-dopant compounds are the heterocyclic radicals or diradicals, the dimers, oligomers, polymers, dispiro compounds and polycycles of:

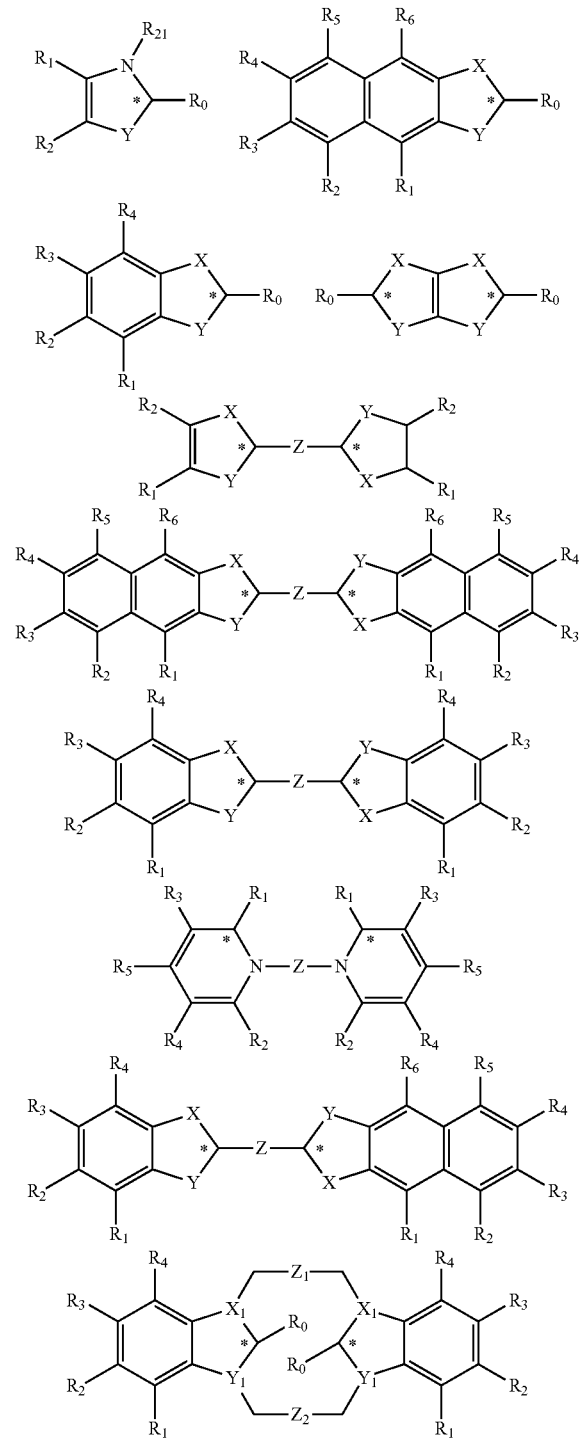

where the bridges Z, $Z_1$ and $Z_2$ can be independently selected from alkyl, alkenyl, alkinyl, cycloalkyl, silyl; alkylsilyl, diazo, disulfide, heterocycloalkyl, heterocyclyl, piperazinyl, dialkylether, polyether, alkylamine, arylamine, polyamine, Aryl and heteroaryl; X and Y can be O, S, N, $NR_{21}$, P, or $PR_{21}$; $R_{0-19}$, $R_{21}$, $R_{22}$ and $R_{23}$ are independently chosen from substituted or unsubstituted: aryl, heteroaryl, heterocyclyl, diarylamine, diheteroarylamine, dialkylamine, heteroarylalkylamine, arylalkylamine, H, F, cycloalkyl, halocycloalkyl, heterocycloalkyl, alkyl, alkenyl, alkinyl, trialkylsilyl, triarylsilyl, halogen, styryl, alkoxy, aryloxy, thioalkyl, thioaryl, silyl and trialkylsilylalkanyl, or $R_{0-19}$, $R_{21}$, $R_{22}$ and $R_{23}$, are part of a (hetero)aliphatic or (hetero)aromatic ring system alone or in combination.

Illustrative examples of suitable organic n-dopants include:

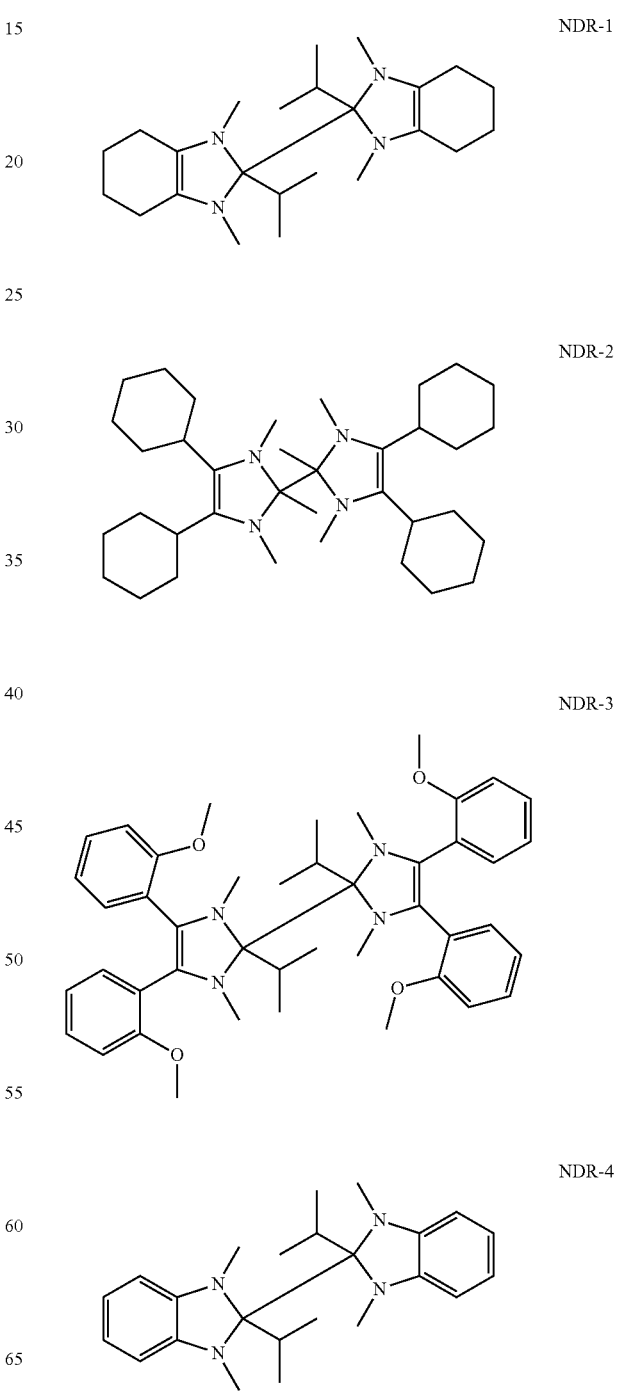

NDR-5

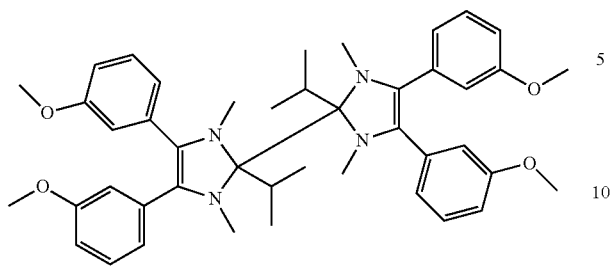

Other examples include 2,2'-diisopropyl-4,5-bis(2-methoxyphenyl)-4',5'-bis(3-methoxyphenyl)-1,1',3,3'-tetramethyl-2,2',3,3'-tetrahydro-1H,1'H-2,2'-biimidazole; 2,2'-Diisopropyl-4,5-bis(2-methoxyphenyl)-4',5'-bis(4-methoxyphenyl)-1,1',3,3'-tetramethyl-2,2',3,3'-tetrahydro-1H,1'H-2,2'-biimidazole; 2,2'-Diisopropyl-1,1',3,3'-tetramethyl-2,2',3,3',4,4',5,5',6,6',7,7'-dodecahydro-2,2'-bibenzo [d] imidazole; 2,2'-Diisopropyl-4,4',5,5'-tetrakis(4-methoxyphenyl)-1,1',3,3'-tetramethyl-2,2',3,3'-tetrahydro-2,2'-biimidazole; 2-Isopropyl-1,3-dimethyl-2,3,6,7-tetrahydro-5,8-dioxa-1,3-diaza-cyclopenta[b]naphthene; Bis-[1,3-dimethyl-2-isopropyl-1,2-dihydro-benzimidazolyl-(2)]; and 2,2'-Diisopropyl-4,5-bis(2-methoxyphenyl)-4',5'-bis(4-methoxyphenyl)-1,1',3,3'-tetramethyl-2,2',3,3'-tetrahydro-2,2'-biimidazole.

The invention is not particularly limited in regards to the electron transporting host in the n-DOL. Preferred classes of electron transporting materials include metal oxinoids, polycyclic aromatic hydrocarbons such as anthracenes, rubrenes, fluoranthenes and phenanthrolines.

Specific examples of phenanthrolines suitable as the electron transporting material in the n-DOL include:

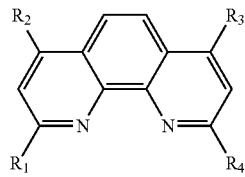

where $R_1$-$R_4$ are independently selected from H, F, Cl, Br, substituted or unsubstituted alkyl or aryl, and substituted or unsubstituted heteroalkyl or heteroaryl. The aromatic carbons which belong to only one ring can also be independently substituted by nitrogen or by C—CN, or C—F.

Selected illustrative examples of suitable phenanthrolines include:

NPH-1

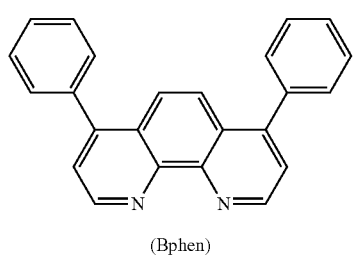

(Bphen)

NPH-2

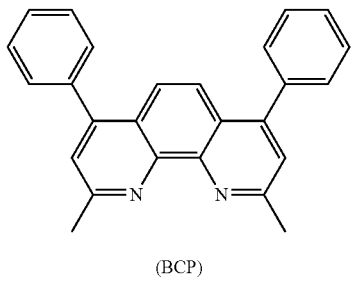

(BCP)

NPH-3

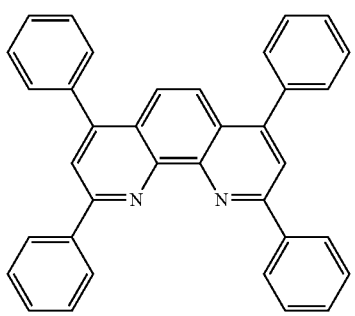

NPH-4

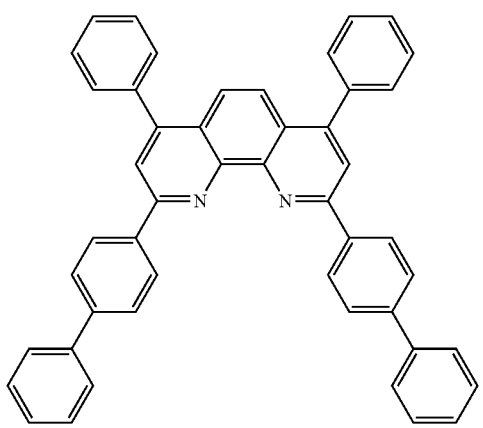

NPH-5

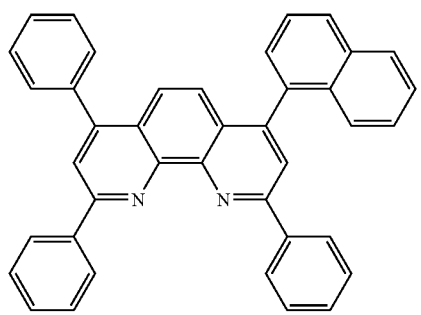

-continued

NPH-6
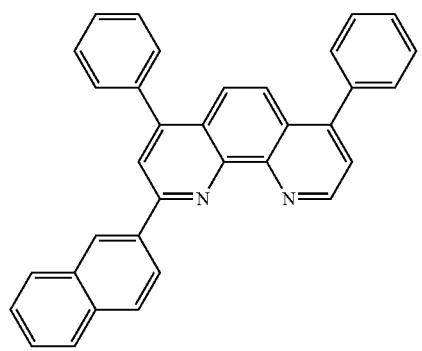

NPH-7
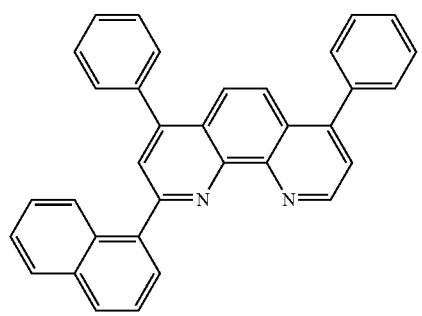

NPH-8
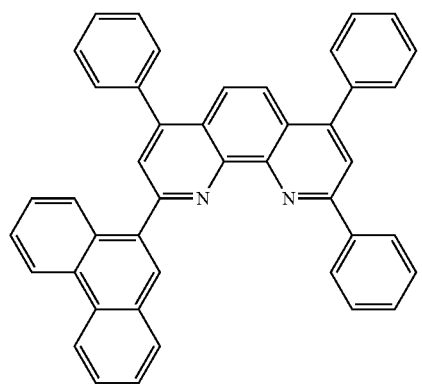

NPH-9
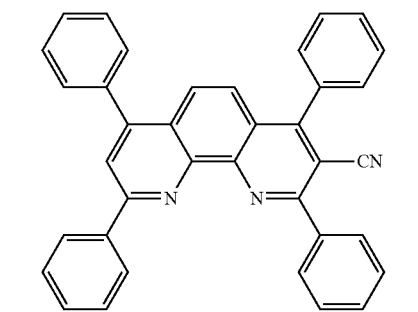

Suitable examples of metal oxinoids suitable as the electron transporting material in the n-DOL include metal complexes of 8-hydroxyquinoline and similar derivatives according to Formula NMOH:

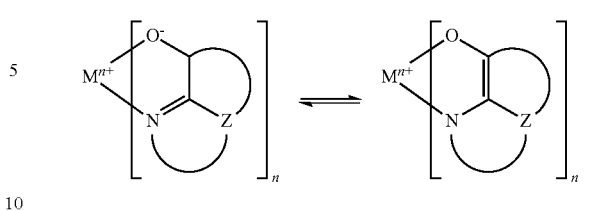
(NMOH)

wherein M represents a metal; n is an integer of from 1 to 4; and Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such as aluminum or gallium, or a transition metal such as zinc or zirconium. Generally any monovalent, divalent, trivalent or tetravalent metal known to be an useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

NMOH-1: Aluminum trisoxine [alias, tris(8-quinolinolato)aluminum(III), Alq or Alq$_3$]

NMOH-2: Magnesium bisoxine [alias, bis(8-quinolinolato)magnesium(II)]

NMOH-3: Bis[benzo{f}-8-quinolinolato]zinc (II)

NMOH-4: Bis(2-methyl-8-quinolinolato)aluminum(III)-μ-oxo-bis(2-methyl-8-quinolinolato) aluminum(III)

NMOH-5: Indium trisoxine [alias, tris(8-quinolinolato)indium]

NMOH-6: Aluminum tris(5-methyloxine) [alias, tris(5-methyl-8-quinolinolato) aluminum(III)]

NMOH-7: Lithium oxine [alias, (8-quinolinolato)lithium (I)]

NMOH-8: Gallium oxine [alias, tris(8-quinolinolato)gallium(III)]

NMOH-9: Zirconium oxine [alias, tetra(8-quinolinolato) zirconium(IV)]0 and

NMOH-10: Bis(2-methyl-8-quinolinato)-4-phenylphenolatoaluminum (III).

Specific examples of polycyclic aromatic hydrocarbons suitable as the electron transporting material in the n-DOL include anthracene compounds according to Formula (NAH):

Formula (NAH)
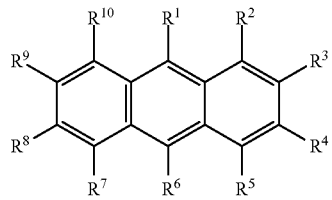

In Formula (NAH), $R^1$ and $R^6$ each independently represent an aryl group having 6-24 carbon atoms such as a phenyl group or a naphthyl group. $R^2$-$R^5$ and $R^7$-$R^{10}$ are each independently chosen from hydrogen, allyl groups from 1-24 carbon atoms or aromatic groups from 6-24 carbon atoms.

In one suitable embodiment $R^1$ and $R^6$ each represent an independently selected phenyl group, biphenyl group, or naphthyl group, $R^3$ represents a hydrogen or a phenyl or naphthyl group, and $R^2$, $R^4$, $R^5$, $R^7$-$R^{10}$ represent hydrogen.

Illustrative examples of useful anthracenes are listed below.

NAH-1

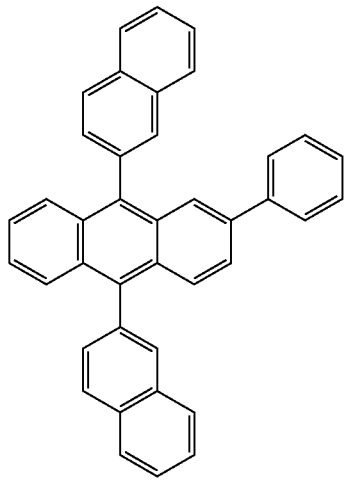

NAH-2

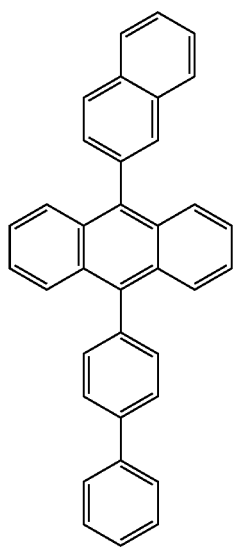

NAH-3

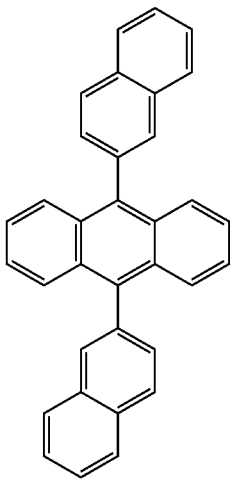

NAH-4

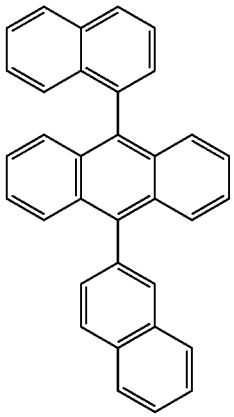

Specific examples of rubrenes suitable as the electron transporting material in the n-DOL include may be represented by Formula (NRH):

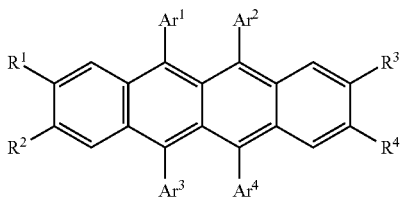

(NRH)

In Formula (NRH), $Ar^1$-$Ar^4$ represent independently selected aromatic groups, for example, phenyl groups, tolyl groups, naphthyl groups, 4-biphenyl groups, or 4-t-butylphenyl groups. In one suitable embodiment, $Ar^1$ and $Ar^4$ represent the same group, and independently of $Ar^1$ and $Ar^4$, $Ar^2$ and $Ar^3$ are the same. $R^1$-$R^4$ independently represent hydrogen or a substituent, such as a methyl group, a t-butyl group, or a fluoro group. In one embodiment $R^1$ and $R^4$ are not hydrogen and represent the same group.

NRH-1

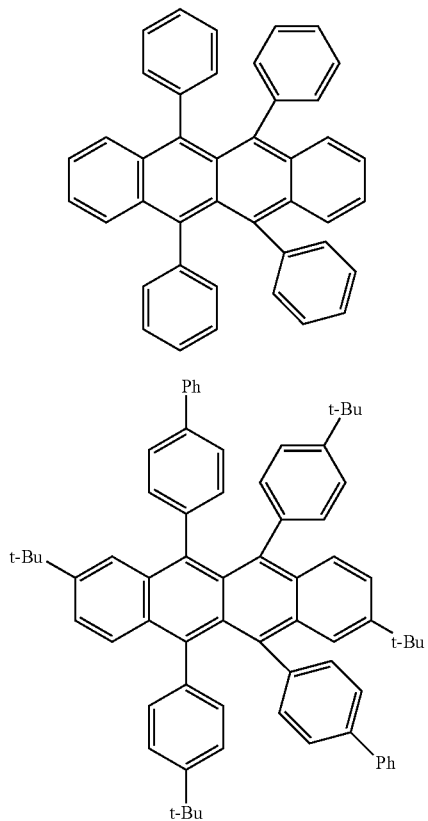

NRH-2

Illustrative examples of useful electron-transporting fluoranthene derivatives are shown below.

NFH-1

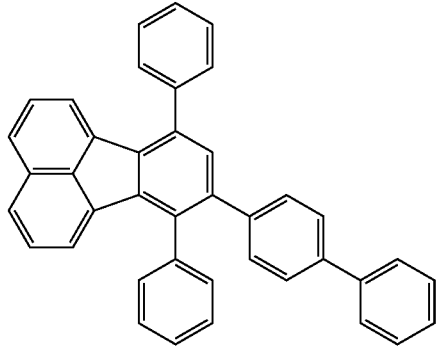

NFH-2

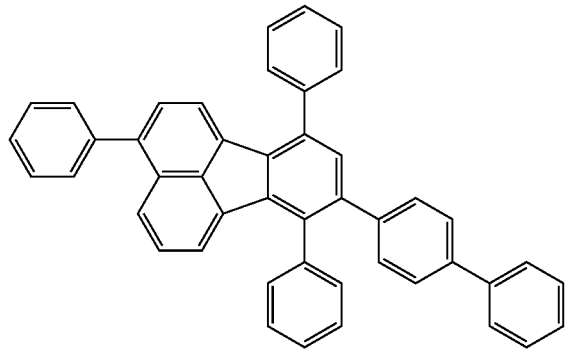

Specific examples of polycyclic aromatic hydrocarbons suitable as the electron transporting material in the n-DOL include fluoranthenes according to Formula (NFH):

Formula (NFH)

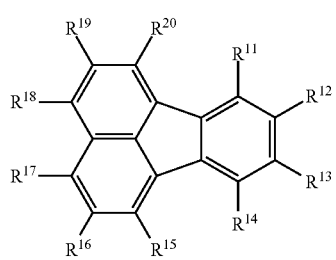

NFH-3

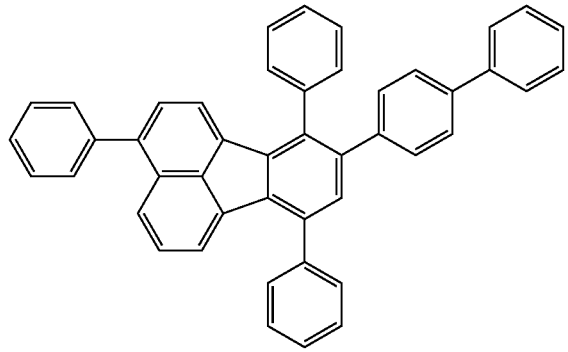

In Formula (NFH), $R^{11}$-$R^{20}$ are independently chosen from hydrogen, alkyl groups from 1-24 carbon atoms or aromatic groups from 6-24 carbon atoms provided adjacent groups can combine to form fused aromatic rings. In one desirable embodiment, $R^{11}$ and $R^{14}$ represent aryl groups and $R^{12}$, $R^{13}$ and $R^{15}$-$R^{20}$ are independently chosen from hydrogen, alkyl groups from 1-24 carbon atoms or aromatic groups from 6-24 carbon atoms provided adjacent groups cannot combine to form fused aromatic rings. Particularly desirable are fluoranthenes where $R^{11}$ and $R^{14}$ are both aryl groups, particularly phenyl, and $R^{15}$, $R^{16}$, $R^{19}$ and $R^{20}$ are all hydrogen. Suitable fluoranthene compounds can be prepared using known synthetic methods or modification thereof, for example, by methods similar to those described by Marappan Velusamy et al., *Dalton Trans.*, 3025-3034 (2007) or P. Bergmann et al., *Chemische Berichte*, 828-35 (1967).

NFH-4

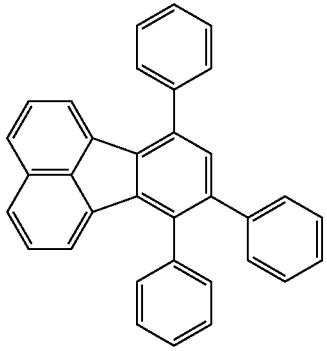

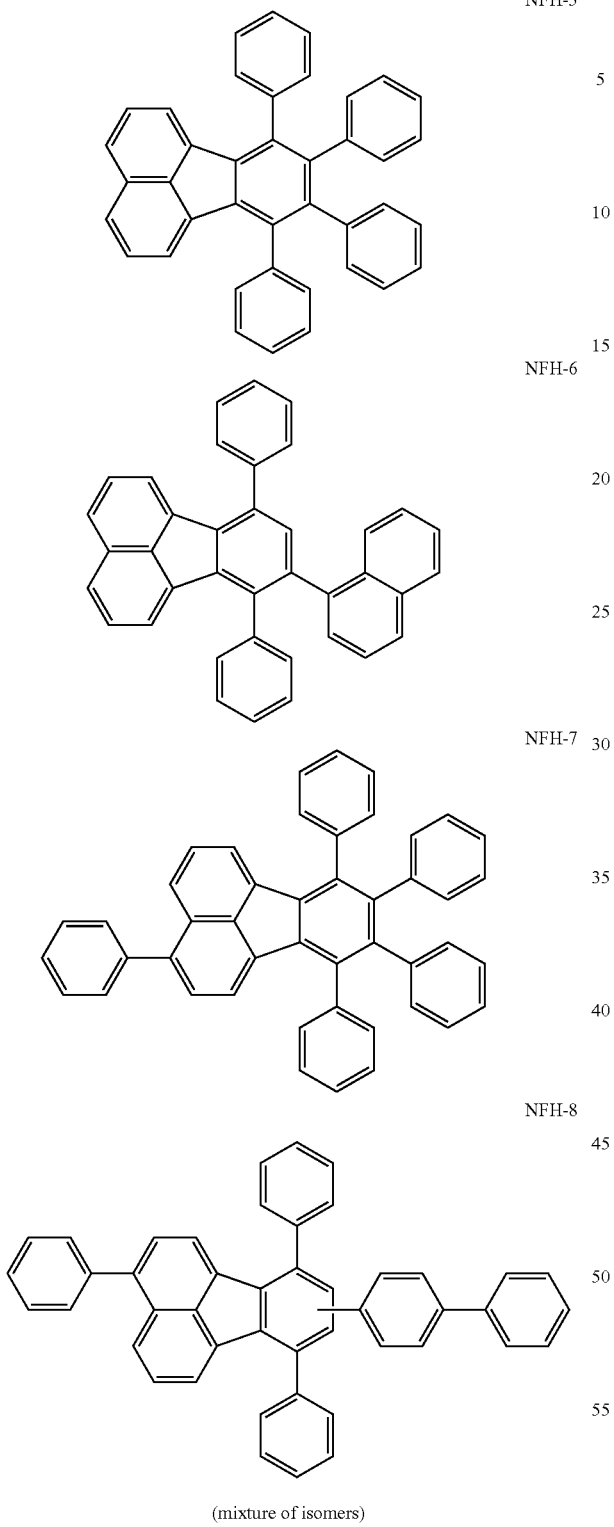

(mixture of isomers)

When used in an OLED, the inventive n-DOL is not light emissive; that is, it does not provide any significant (less than 10% of the total) amount of light. The thickness can be between 5 to 150 nm, preferably between 5 to 70 nm and more preferably between 10 to 50 nm. There may be more than one electron-transporting host and there may be more than one organic n-dopant present. The ratio of host(s) to n-dopant is not critical; however, the molar doping concentration is in the range of 1:1000 (dopant molecule: host molecule) and 1:1, preferably between 1:500 and 1:2, and more preferably between 1:100 and 1:10. In individual cases doping concentrations larger than 1:1 can be applied, for example, if large conductivities are required.

However, the use of am organic n-dopant does not always provide the desired voltage and stability. In order to make effective use of an organic n-dopant as part of a 'pn' junction, it is critical to use an intermediate layer (IL) between the n-DOL and p-DOL which contains a material that has a LUMO that is more negative than −3.0 eV. This type of material generally has good electron mobility properties. The IL is in direct physical contact with the n-DOL and p-DOL.

This interlayer should not contain any metals, totally inorganic compounds or be additionally doped with a more reducing or oxidizing compound. However, the interlayer can contain materials that can also be organometallic as well as totally organic. Preferably, the IL consists essentially (greater than 99% by volume) of a single compound. If the IL is produced with a combination of materials, this combination of materials should not form an electrical doped layer. In other words, the energy levels of the materials used in the co-deposition of the IL is such that no energy transfer (positive or negative) occurs from the LUMO of one material to the HOMO of the other material.

One class of suitable materials for use in the interlayer of the ICR are metal complexes of phthalocyanines such as copper phthalocyanine (CuPC), Zn phthalocyanine (ZnPC) or magnesium phthalocyanine (MgPc). The phthalocyanine rings may be optionally substituted. Of these, CuPC is highly preferred.

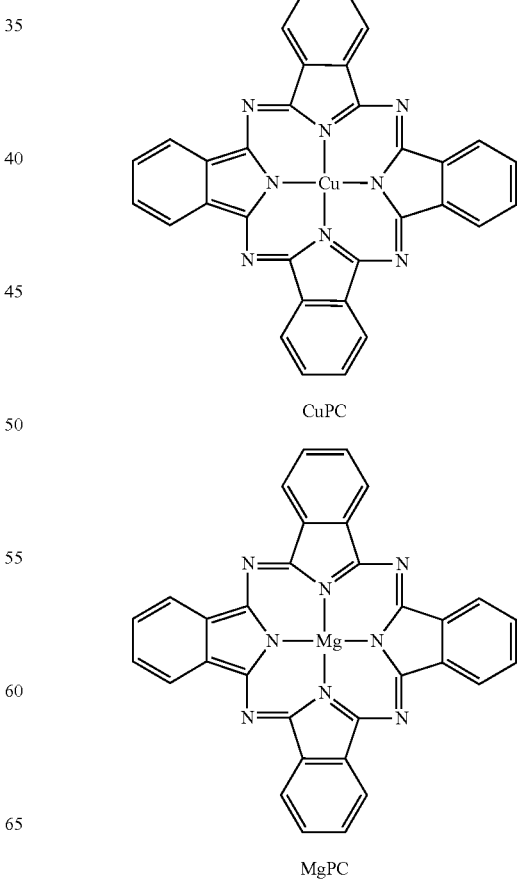

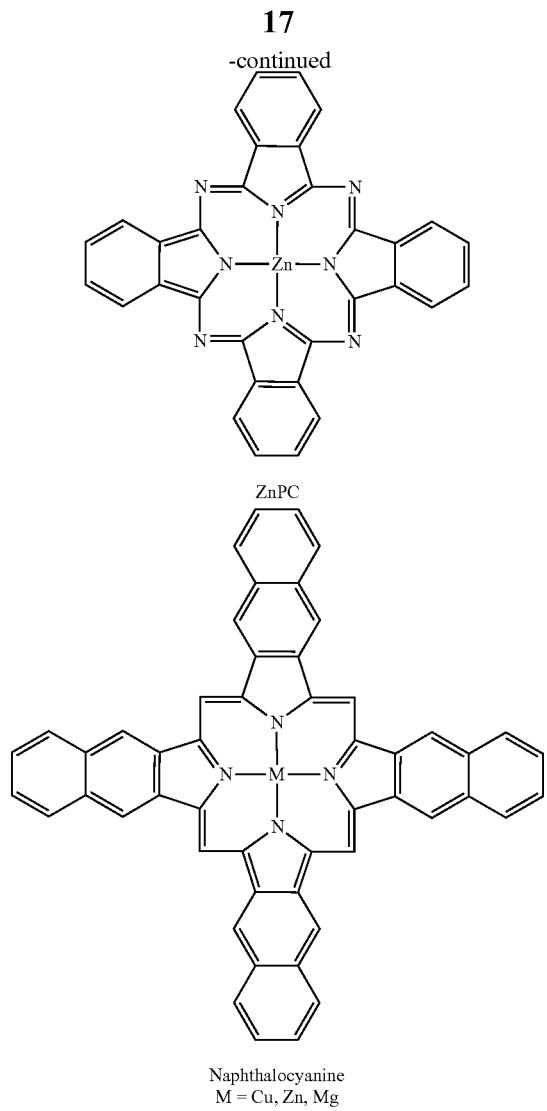

ZnPC

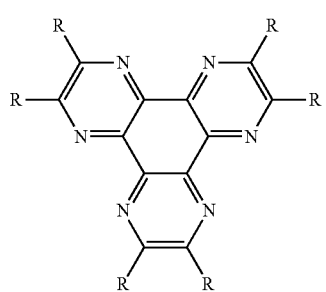

Naphthalocyanine
M = Cu, Zn, Mg

Another class of suitable materials for use in the interlayer of the ICR are hexaazatriphenylene compounds such as those described in Szalay et al, J. Cluster Sci, 15(4) 503-530 (2004), Kanakarajan et al, JOC, 51(26) 5231-3 (1986), U.S. Pat. No. 6,436,559 and U.S. Pat. No. 6,720,573. Preferred are compounds of Formula (HAT).

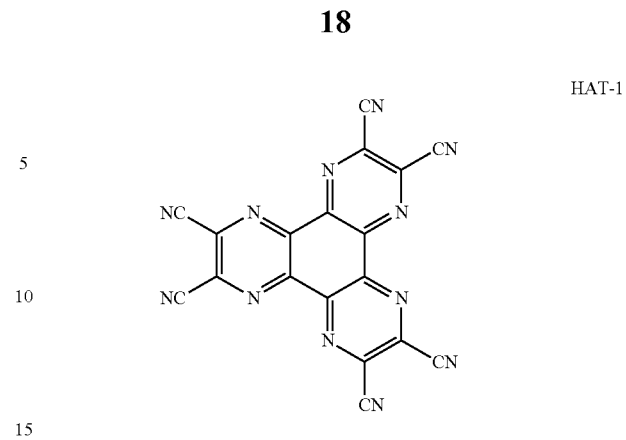

In Formula (HAT), R independently represents hydrogen or an independently selected substituent, at least one R represents an electron-withdrawing substituent having a Hammett's sigma para value of at least 0.3. Particularly preferred is HAT-1 where R is cyano:

When used in an OLED, the inventive IL of the ICR is not light emissive; that is, it does not provide any significant (less than 10% of the total) amount of light. The thickness can be between 1 to 15 nm, preferably between 2 to 10 mm and more preferably between 3 to 7 nm In direct contact with the IL of the ICR on the side opposite of the n-DOL, there is an organic p-type layer (p-DOL). An organic p-type layer preferentially conducts holes. For the purposes of this invention, an organic p-type layer consists of materials that contain no metals, metallic substances or metal ions at all. Species that are metals with organic ligands are not materials of the organic p-type type layer of this invention. The p-DOL includes an organic p-type material, either alone or in combination with a hole transporting host. When there is a host compound and a p-type material, the p-DOL is a p-type doped organic layer. This means that this layer has semiconducting properties after doping, and the electrical current through this layer is substantially carried by the holes. The conductivity is provided as a result of electron transfer from LUMO of the host (hole transport material) to the HOMO of the dopant. The p-doping therefore increases considerably the charge carrier density of the host. The conductivity, which is initially very low, is increased by generating charge carriers in the host material. Doping in this case leads to an increase in the conductivity of charge transport layers, as a result of which ohmic losses in charge transport are reduced, and to an improved transfer of the charge carriers between the contacts and the organic layer.

An organic p-type material is a molecule or a neutral radical or combination thereof with a LUMO more negative than −4.5 eV, preferably more negative than −4.8 eV, and more preferably more negative than −5.04 eV. The molar mass of the p-type material is preferably in the range of 200 to 2000 g/mol, more preferably between 300 and 1000 g/mol, and even more preferably between 600 g/mol and 1000 g/mol. The acceptor can be created by a precursor during the layer forming (deposition) process or during a subsequent process of layer formation.

One suitable class of p-type material suitable for use in the p-DOL of the ICR are hexaazatriphenylene compounds such as those of Formula (HAT). A very desirable compound for use in the p-DOL is HAT-1.

Another suitable class of materials for use as p-type material in the p-DOL of the ICR are fluorinated derivatives of cyanobenzoquinonedimethanes such as those described in EP1912268, WO2007/071450 and US20060250076. Specific examples of fluorinated derivatives of cyanobenzoquinonedimethanes include:

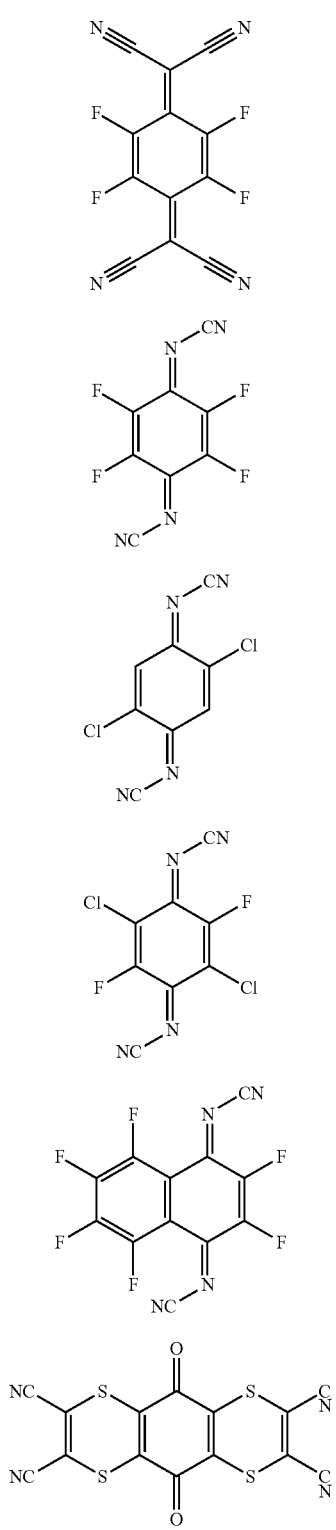

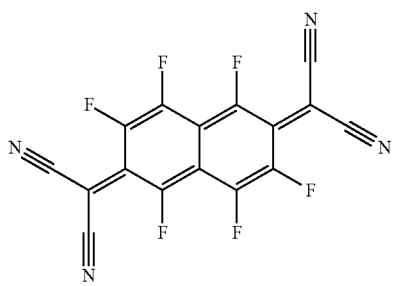

Preferred is TCNQ-7.

Yet another class of material for use as p-type material in the p-DOL of the ICR are radialenes such as those described in US20080265216, Iyoda et al, Organic Letters, 6(25), 4667-4670 (2004), JP3960131, Enomoto et al, Bull. Chem. Soc. Jap., 73(9), 2109-2114 (2000), Enomoto et al, Tet. Let., 38(15), 2693-2696 (1997) and Iyoda et al, JCS, Chem. Comm., (21), 1690-1692 (1989).

Some illustrative examples of radialenes include:

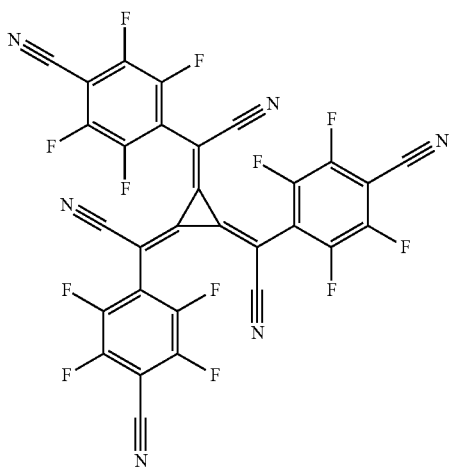

PR-1

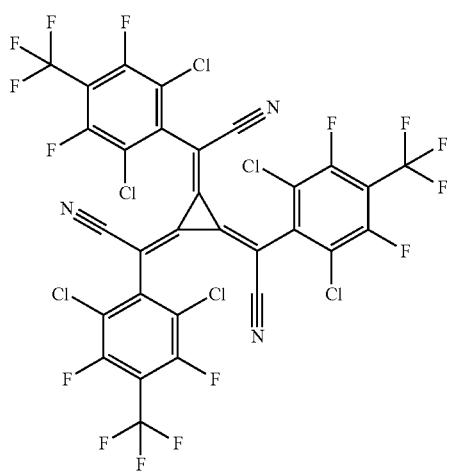

PR-2

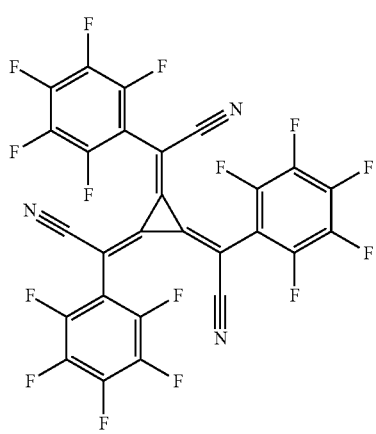

PR-3

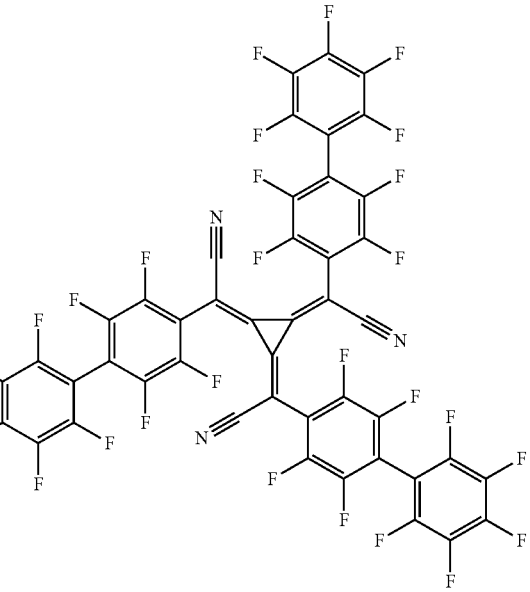

PR-4

PR-5

Preferred is PR-1.

Some of the same classes of materials suitable for the IL of the ICR can also be used for the p-DOL of the ICR. However, the same material or same class of material cannot be used in both the IL and p-DOL in the same device. The material in the p-DOL should have a more negative LUMO value than the material present in the IL.

In some instances, it is desirable to use host materials in the p-DOL that are compounds that have excellent hole-transporting properties in combination with the p-type material. Preferred materials for the p-DOL host are tertiary aromatic amines.

Suitable classes of aromatic tertiary amines are those which include at least two aromatic tertiary amine moieties as described in U.S. Pat. Nos. 4,720,432 and 5,061,569. Such compounds include those represented by structural Formula (A)

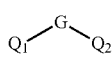

(A)

Wherein $Q_1$ and $Q_2$ are independently selected aromatic tertiary amine moieties; and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene or carbazole. When G is an aryl group, it is conveniently a phenylene, biphenylene, or naphthalene moiety.

A useful class of triarylamines satisfying structural Formula A and containing two triarylamine moieties is represented by structural Formula (B)

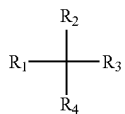

(B)

Wherein $R_1$ and $R_2$ each independently represents a hydrogen atom, an aryl group, or an alkyl group or $R_1$ and $R_2$ together represent the atoms completing a cycloalkyl group; and $R_3$ and $R_4$ each independently represents an aryl group, which is in turn substituted with a diaryl substituted amino group, as indicated by structural Formula (C)

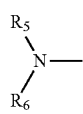

(C)

Wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by Formula (C), linked through an arylene group. Useful tetraaryldiamines include those represented by Formula (D)

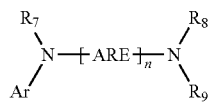

(D)

wherein each ARE is an independently selected arylene group, such as a phenylene or anthracene moiety, n is an integer of from 1 to 4; and Ar, $R_7$, $R_9$, and $R_9$ are independently selected aryl groups. In a typical embodiment, at least one of Ar, $R_7$, $R_8$, and $R_9$ is a polycyclic fused ring structure, e.g., a naphthalene or carbazole.

Another class of the hole-transporting material comprises a material of formula (E):

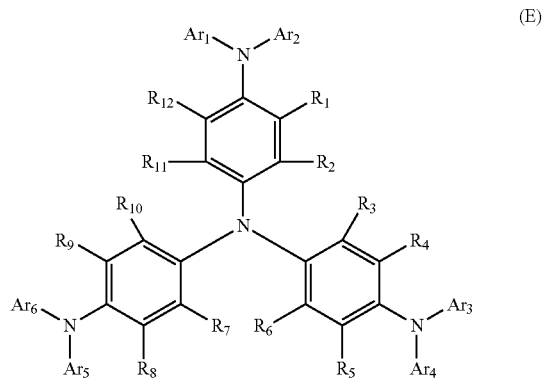

(E)

In formula (E), $Ar_1$-$Ar_6$ independently represent aromatic groups, for example, phenyl groups or tolyl groups, and $R_1$-$R_{12}$ independently represent hydrogen or independently selected substituent, for example an alkyl group containing from 1 to 4 carbon atoms, an aryl group, a substituted aryl group.

Illustrative of useful aromatic tertiary amines are the following: 1,1-bis(4-di-p-tolylaminophenyl)cyclohexane; 1,1-bis(4-di-p-tolylaminophenyl)-4-phenylcyclohexane; 1,5-bis[N-(1-naphthyl)-N-phenylamino]naphthalene; 2,6-bis(di-p-tolylamino)naphthalene; 2,6-bis[di-(1-naphthyl)amino]naphthalene; 2,6-bis[N-(1-naphthyl)-N-(2-naphthyl)amino]naphthalene; 2,6-bis[N,N-di(2-naphthyl)amine]fluorene; 4-(di-p-tolylamino)-4'-[4(di-p-tolylamino)-styryl]stilbene; 4,4'-bis(diphenylamino)quadriphenyl; 4,4"-bis[N-(1-anthryl)-N-phenylamino]-p-terphenyl; 4,4'-bis[N-(1-coronenyl)-N-phenylamino]biphenyl; 4,4'-bis[N-(1-naphthyl)-N-phenylamino]biphenyl (NPB); 4,4'-bis[N-(1-naphthyl)-N-(2-naphthyl)amino]biphenyl (TNB); 9,9'-[1,1'-biphenyl]-4,4'-diylbis-9H-carbazole (CBP); 9,9'-(1,3-phenylene)bis-9H-carbazole (mCP); 4,4"-bis[N-(1-naphthyl)-N-phenylamino]p-terphenyl; 4,4'-bis[N-(2-naphthacenyl)-N-phenylamino]biphenyl; 4,4'-bis[N-(2-naphthyl)-N-phenylamino]biphenyl; 4,4'-bis[N-(2-perylenyl)-N-phenylamino]-biphenyl; 4,4'-bis[N-(2-phenanthryl)-N-phenylamino]biphenyl; 4,4'-bis[N-(2-pyrenyl)-N-phenylamino]biphenyl; 4,4'-bis[N-(3-acenaphthenyl)-N-phenylamino]biphenyl; 4,4'-bis[N-(3-methylphenyl)-N-phenylamino]biphenyl (TPD); 4,4'-bis[N-(8-fluoranthenyl)-N-phenylamino]biphenyl; 4,4'-bis[N-(9-anthryl)-N-phenylamino]biphenyl; 4,4'-bis{N-phenyl-N-[4-(1-naphthyl)-phenyl]amino}biphenyl; 4,4'-bis[N-phenyl-N-(2-pyrenyl)amino]biphenyl; 4,4',4"-tris[(3-methylphenyl)phenylamino]triphenylamine (m-TDATA); Bis(4-dimethylamino-2-methylphenyl)-phenylmethane; N-phenylcarbazole; N,N'-bis[4-([1,1'-biphenyl]-4-ylphenylamino)phenyl]-N,N'-di-1-naphthalenyl-[1,1'-biphenyl]-4,4'-diamine; N,N'-bis[4-(di-1-naphthalenylamino)phenyl]-N,N'-di-1-naphthalenyl-[1,1'-biphenyl]-4,4'-diamine; N,N'-bis[4-[(3-methylphenyl)phenylamino]phenyl]-N,N-diphenyl-[1,1'-biphenyl]-4,4'-diamine; N,N-bis[4-(diphenylamino)phenyl]-N',N'-diphenyl-[1,1'-biphenyl]-4,4'-diamine; N,N'-di-1-naphthalenyl-N,N'-bis[4-(1-naphthalenylphenylamino)phenyl]-[1,1'-biphenyl]-4,4'-diamine; N,N'-di-1-naphthalenyl-N,N'-bis[4-(2-naphthalenylphenylamino)phenyl]-[1,1'-biphenyl]-4,4'-diamine; N,N,N-tri(p-tolyl)amine; N,N,N',N'-tetra-p-tolyl-4-4'-diaminobiphenyl; N,N,N',N'-tetraphenyl-4,4'-diaminobiphenyl; N,N,N',N'-tetra-1- naphthyl-4,4'-diaminobiphenyl; N,N,N',N'-tetra-2-naphthyl-4,4'-diaminobiphenyl; and N,N,N',N'-tetra(2-naphthyl)-4,4"-diamino-p-terphenyl.

When used in an OLED, the inventive p-DOL of the ICR is not light emissive; that is, it does not provide any significant (less than 10% of the total) amount of light. The ICR is reverse polarized (charges are created instead of recombined) therefore it does not emit light. The thickness can be between 5 to 150 nm, preferably between 5 to 70 nm and more preferably between 10 to 50 nm. The ratio of host(s) to n-dopant is not critical; however, the molar doping concentration is in the range of 1:1000 (dopant molecule: host molecule) and 1:1, preferably between 1:500 and 1:2, and more preferably between 1:100 and 1:10. In individual cases doping concentrations larger than 1:1 are applied, e.g. if large conductivities are required.

This invention is also particularly useful in so-called tandem or stacked OLED devices. In this case the ICR is located between two electroluminescent (EL) units. These EL units are phototransducing. Tandem OLED devices generally comprise a cathode, a $1^{st}$ EL unit, an intermediate connecting region (ICR), a $2^{nd}$ EL unit and an anode. Each individual EL unit comprises light-emitting layer(s) (LEL), electron-transporting layer(s) (ETL) and electron-injecting layer(s) (EIL) and optionally additional layers such as hole-injecting layer(s), hole-transporting layer(s), exciton-blocking layer(s), spacer layer(s) and hole-blocking layer(s).

An OLED can be constructed with many different layer combinations. Each layer has at least one specific function and therefore it comprises a material or material mixture with features to satisfy the layer function requirements. Basic OLED information can be found in Chen, Shi, and Tang, "Recent Developments in Molecular Organic Electroluminescent Materials," *Macromol. Symp.* 125, 1 (1997) and the references cited therein; Hung and Chen, "Recent Progress of Molecular Organic Electroluminescent Materials and Devices," *Mat. Sci. and Eng.* R39, 143 (2002) and the references cited therein. A very general structure for a simple OLED is described below to clarify the nomenclature:

Substrate: The substrate supports the OLED. It can be flexible or rigid, transparent, opaque, reflective, or translucent. The substrate should be transparent or translucent for bottom emitting OLEDs.

Bottom electrode (Anode): The bottom electrode must be conductive. For bottom emitting OLEDs, it must also be transparent. Usually transparent conductors (TCOs) like ITO are used. The bottom electrode can also comprise a very thin metal layer or conductive organic semiconductor. For top emitting OLEDs, the bottom electrode can comprise thicker conductive layers, such as metals or conductive carbon. Optionally, the bottom electrode can be the substrate at the same time.

Hole injection layer NIL): The anode can be treated to have a very low work function which facilitates the extraction of electrons from the HOMO of the adjacent hole transport layers (injection of holes from the anode into the HTL). A more stable way to provide the injection is to use a layer comprising strong acceptors as hole injection layers; organic p-dopants can be used for this purpose. The hole injection layer can be a pure layer of p-dopant and can be about 1 nm thick. If HTL is p-doped, then the injection layer may not be necessary.

Hole Transport layer (HTL): This layer supports the transport of positive charge carriers (holes) from the anode to the LEL. This layer can be doped with p-dopants to lower its resistivity and to avoid the respective power loss due to the high resistivity of the undoped semiconductor. The doped HTL can also be used as optical spacer, because it can be made very thick, up to 1000 nm or more without significant increase in resistivity.

HTL side electron blocking layer (EBL): This layer has a high LUMO, more positive than the LUMO from the adjacent LEL, such that electrons from the LEL cannot be efficiently injected into the EBL, i.e. electrons from the LEL are blocked. This layer may preferably have a HOMO such that the holes are easily transferred from the HTL into the LEL. Rules for designing EBL for high efficient OLEDs are given in US20040062949.

Light Emitting layer(s) (LEL): The light emitting layers must have at least one layer comprising an emission material (the layer comprising the emission material is also called EML) and can optionally comprise additional layers to block excitons (XBL or exciton blocking layer). LEL can also comprise additional layers to be used as spacer. The LEI can additionally comprise layers to improve charge carrier injection from the adjacent layers to the EML, where the additional layers are sometimes called hole injection layers and electron injection layers but should not be confused with the anode side hole injection layer and the cathode side electron injection layer. Here the LUMO of the electron injection layer is close to the LUMO of the EML and the HOMO of the hole injection layer is close to the HOMO of the EML, where in the anode side hole injection layer the LUMO of the hole injection layer is close to the HOMO of the HTL, and in the cathode side electron injection layer the HOMO of the electron injection layer is close to the LUMO of the HTL. If the EML comprises a mixture of two or more materials the charge carrier injection can occur in different materials for instance in a material which is not the emitter, or the charge carrier injection can also occur directly into the emitter. Many different energy transfer processes can occur inside the EML or adjacent EMLs leading to different types of emission. For instance excitons can be formed in a host material, which are then transferred as singlet or triplet excitons to an emitter material which can a be singlet or triplet emitter which then emits light. A mixture of different types of emitter can be provided for higher efficiency. Mixed light can be realized by using emission from the EML host and the EML dopant, which materials can be in the same or in different EML. Typically the HBL and EBL have already the correct energy levels to provide a good injection of charge carriers in the EML and block the injection from the opposite charge carriers from the EML into the HBL and EBL at the same time. The LEL may be fluorescent or phosphorescent or a combination of both.

ETL side hole blocking layer (HBL): This layer has a low HOMO, more negative than the HOMO of the EML, such that holes from the EML cannot be efficiently injected into the HBL, i.e. holes from the EML are blocked. This layer may preferably have a LUMO such that the electrons are easily transferred from the ETL to the EML. Rules for designing HBL for high efficient OLEDs are given in US20040062949.

Electron Transport layer (ETL): This layer supports the transport of negative charge carriers (electrons) from the cathode to the LEL. This layer can be doped with n-dopants to lower its resistivity and to avoid the respective power loss due to the high resistivity of the undoped semiconductor. The doped ETL can also be used as optical spacer, because it can be made very thick, up to 1000 nm or more without significant increase in resistivity.

Cathode side electron injection layer (EIL): The device can comprise a buffer layer between the cathode and the ETL. This buffer layer can provide protection against the cathode deposition or metal diffusion from the cathode. Sometimes this buffer layer is called injection layer. Another kind of injection layer is to use a layer comprising n-dopant between the ETL and the Cathode. This layer can be a pure layer of n-dopant which is only about 1 nm thick. The use of the strong donor (n-dopant) as injection layer provides lower voltages and higher efficiency in the device. If the ETL is n-doped, then the injection layer may not be necessary.

Top electrode (Cathode): The cathode can be transparent for top emitting OLEDs. It can be opaque or reflective for bottom emitting OLEDs. It is required that the cathode has a reasonable good conductivity. The cathode can comprise metals, TCOs, conductive polymers, or other conductive organic materials.

In general, if the features of two or more layers can be combined in one layer, then these layers can be collapsed into one, simplifying the fabrication process. A smaller number of layers can be used if the requirements for two or more layers are met by one single layer. For example the EBL and HTL can work as a XBL and therefore an additional XBL is not necessary. For inverted structure, the layer sequence is inverted except for the substrate.

FIG. 1 illustrates a tandem OLED 100. This tandem OLED has an anode 110 and a cathode 170, at least one of which is transparent. Disposed between the anode and the cathode are N EL units and N−1 intermediate connector regions of the invention (each of them indicated as "int. connector" in the figure), where N is an integer greater than 1. The EL units, stacked and connected serially, are designated 120.1 to 120.N, where 120.1 is the first EL unit (adjacent to the anode), 120.2 is the second EL unit, 120.N−1 is the $(N-1)^{th}$ EL unit, and 120.N is the $N^{th}$ EL unit (nearby the cathode). The intermediate connectors, disposed between the EL unit, are designated 130.1 to 130.(N−1), where 130.1 is the first intermediate connector disposed between EL units 120.1 and 120.2; 130.2 is the second intermediate connector in contact with EL unit 120.2 and another EL unit (not shown in the figure); and 130.(N−1) is the last intermediate connector disposed between EL units 120.(N−1) and 120.N. The tandem OLED 100 is externally connected to a voltage/current source 180 through electrical conductors 190. Tandem OLED 100 is operated by applying an electric potential produced by a voltage/current source 180 between a pair of contact electrodes, anode 110 and cathode 170. Under a forward bias of (V×N), this externally applied electrical potential is distributed among the N EL units and the N−1 intermediate connectors.

Figure 2:
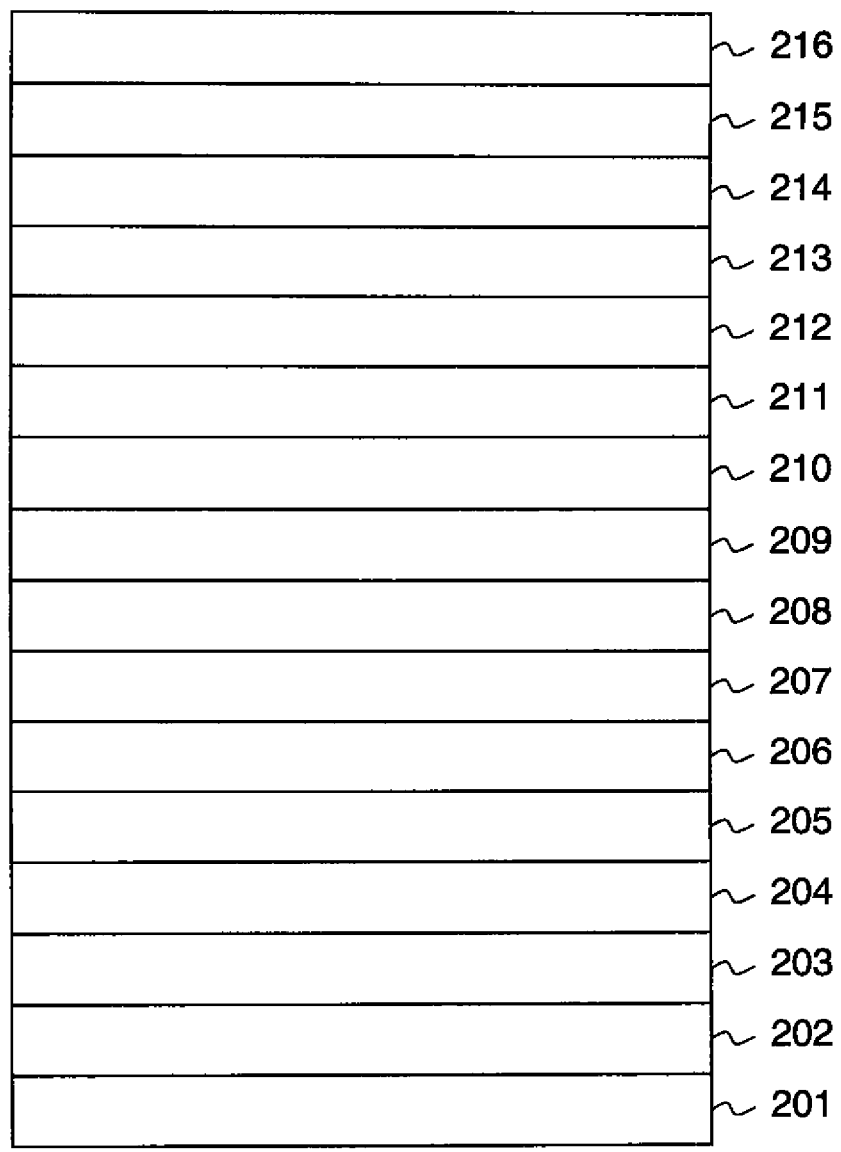
FIG. 2 shows a schematic cross-sectional view of a particular embodiment as a solar cell device of the present invention.

FIG. 2 shows one embodiment of the invention as an organic solar cell device 200. On the substrate 201, the following layers are deposited in the following sequence: anode 202, hole injection layer 203, hole transport layer 204, electron blocking layer 205, first photoactive layer 206, hole blocking layer 207, n-doped organic layer 208, intermediate layer 209, p-type organic layer 210, electron blocking layer 211, second photoactive layer 212, hole blocking layer 213, electron transport layer 214, electron injection layer 215 and cathode 216. The cathode and anode are connected to electrical connectors (not shown).

Figure 3:
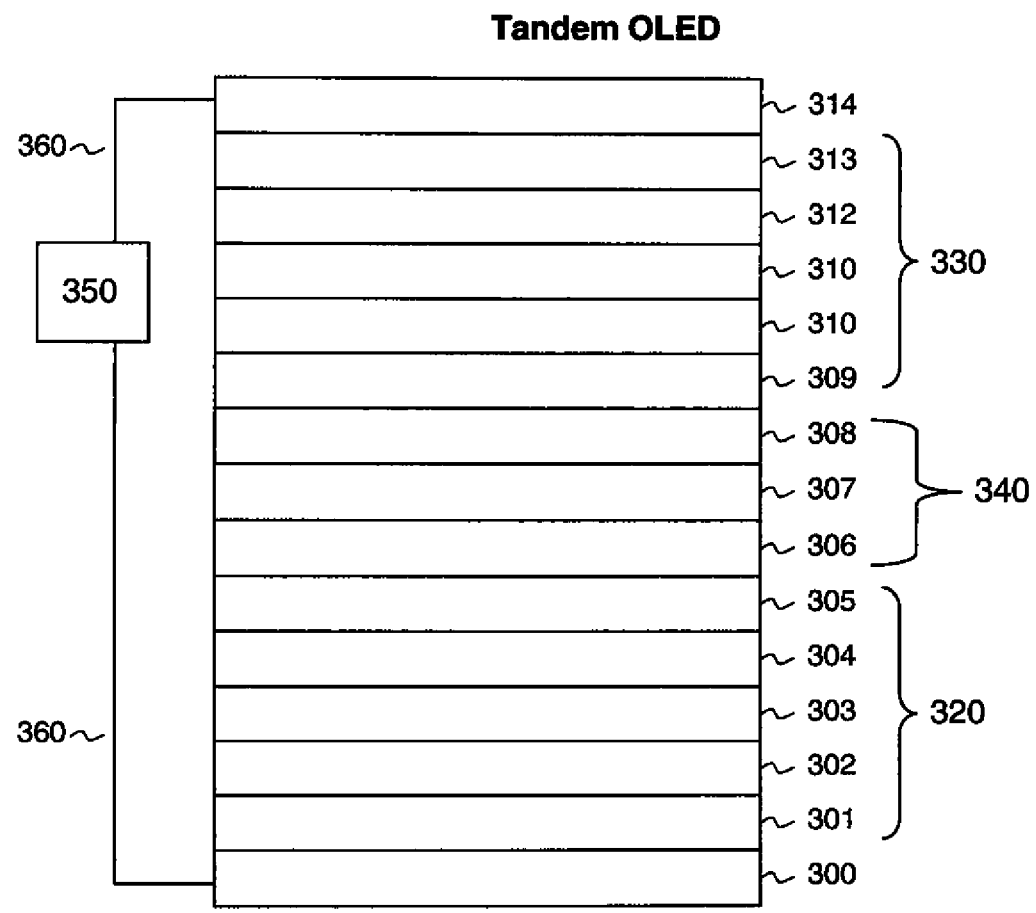
FIG. 3 shows a schematic cross-sectional view of a particular embodiment as a tandem OLED device of the present invention.

FIG. 3 shows one embodiment of the invention as a tandem OLED. The anode 301 is located on the substrate 300. There is a $1^{st}$ electroluminescent unit 320 (including layers 301 to 305), an intermediate connecting region 340 (including layers 306 to 308) and a $2^{nd}$ electroluminescent unit 330 (including layers 309 to 313). Located on top of the $2^{nd}$ EL unit is the cathode 314. The anode 301 and the cathode 314 are connected to a voltage/current source 350 by electrical connectors 360. In the $1^{st}$ EL unit 320, there is a hole injection layer 302, a hole transport layer 303, a blue light emitting layer 304 and an electron transport layer 305. In the 2nd EL unit 330, there is a hole transport layer 309, a red light emitting layer 310, a green light emitting layer 311, an electron transport layer 312 and a electron injection layer 313. In the intermediate connection region 340, there is a n-type doped organic layer 306, an intermediate layer 307 and an organic p-type layer 308.

In one suitable embodiment, the tandem OLED device includes a way for emitting white light, which can include complimentary emitters, a white emitter, or a filtering structure. Embodiments of the current invention can be used in stacked devices that comprise solely fluorescent elements to produce white light. The device can also include combinations of fluorescent emitting materials and phosphorescent emitting materials (sometimes referred to as hybrid OLED devices). To produce a white emitting device, ideally the hybrid fluorescent/phosphorescent device would comprise a blue fluorescent emitter and proper proportions of a green and red phosphorescent emitter, or other color combinations suitable to make white emission. However, hybrid devices having non-white emission can also be useful by themselves. Hybrid fluorescent/phosphorescent elements having non-white emission can also be combined with additional phosphorescent elements in series in a stacked OLED. For example, white emission can be produced by one or more hybrid blue fluorescent/red phosphorescent elements stacked in series with a green phosphorescent element as disclosed in U.S. Pat. No. 6,936,961B2.

In one desirable embodiment the OLED device is part of a display device. In another suitable embodiment the OLED device is part of an area lighting device. The OLED device (if the invention is useful in any device where stable light emission is desired such as a lamp or a component in a static or motion imaging device, such as a television, cell phone, DVD player, or computer monitor.

For full color display the pixilated LELs can be needed. This pixilated deposition of LELs is achieved using shadow masks, integral shadow masks, U.S. Pat. No. 5,294,870, spatially defined thermal dye transfer from a donor sheet, U.S. Pat. Nos. 5,688,551, 5,851,709, and 6,066,357, and inkjet method, U.S. Pat. No. 6,066,357.

OLEDs of this invention can employ various well-known optical effects in order to enhance their emissive properties if desired. This includes optimizing layer thicknesses to yield improved light transmission, providing dielectric mirror structures, replacing reflective electrodes with light-absorbing electrodes, providing anti-glare or anti-reflection coatings over the display, providing a polarizing medium over the display, or providing colored, neutral density, or color-conversion filters over the display. Filters, polarizers, and anti-glare or anti-reflection coatings can be specifically provided over the OLED or as part of the OLED.

The ICR of the invention is also beneficial for stacked organic photovoltaic (solar cell) devices, as the open circuit voltage might be increased to a maximum of n-times the photon energy. In this case, the phototransducing layer(s) generate electricity when exposed to light. The open circuit voltage is increased by nearly the same factor which the short circuit current is decreased; this efficient power extraction with lower currents and higher voltages is highly desired when the series resistance created from the very thin transparent conductors limits the device performance. Another advantage of stacked (or tandem) organic solar cells is that the intrinsic photo-active layers can be made very thin, allowing a higher fill factor, where the loss of absorption from the thin layers is compensated by the multiplicity of intrinsic photo-active layers. The stacking of photovoltaic devices thus allows harvesting of more than 50% of the incident light due to the presence of more than one photoactive layer in the stack. It is highly desired that all the layers, including the ICR in organic solar cells are highly thermally stable and transparent. Furthermore, the ICR does not contribute to the photocurrent, since it is polarized in a way to recombine and not generate charge carriers. It is also constructed in a way to recombine charge carriers with a minimal loss in open circuit voltage.

A conventional-layered small molecule organic solar cell (OSC) is described below. The organic solar cell is also a diode; therefore the layer names are similar to the names for OLEDs. The layer names are made in reference to a diode polarized in the forward direction (conductive direction).

Substrate: Bottom electrode (Anode): Same as for an OLED

Anode side hole injection layer (HIL): Same as for an OLED

Hole Transport layer (HTL): Same as for an OLED

Photoactive layer: The photo active (phototranducing) layer comprises absorber material, donor-material and acceptor material. The donor and acceptor material permits exciton separation into positive and negative charge carriers. The donor and acceptor are much weaker than those compounds used for dopants, because they need to separate the charge carriers but still keep them at an energy level which is high enough such that useful energy can be extracted from the device. This donor and acceptor material pair can be formed into separated layers called a donor-acceptor heterojunction or into a single layer, called a bulk donor-acceptor heterojunction. The donor-acceptor pair in the photoactive layer do not exchange charge carriers between each other in their neutral state, i.e. no charge transfer from HOMO of one to the LUMO of the other happens between the neutral molecules (therefore they do not form a doped semiconductor material). The LUMO-HOMO difference between the two materials is larger than 0.5 eV. Typical HOMO levels for the donor is between −4.8 and −5.5 eV. Typical LUMO levels for the acceptor is between −3 to −4.1 eV. The photoactive layer should have high mobility for both types of charge carries such that they can be efficiently transported to the transport layers. In large exciton diffusion length is also desired so that an exciton absorbed in one of the materials can reach the donor-acceptor interface and be separated there. Exciton blocking layers can be included to avoid the excitons to be quenched at the interfaces to the other layers. The photoactive layers can comprise other layers to support absorption, exciton and charge carrier separation, and transport. When used, the LUMO of the electron injection layer is preferably closer to the LUMO of the photoactive layer and the HOMO of the hole injection layer is preferably close to the HOMO of the photoactive layer, wherein the anode side hole injection layer the LUMO of the hole injection layer is preferably close to the HOMO of the HTL, and in the cathode side electron injection layer the HOMO of the electron injection layer is preferably close to the LUMO of the HTL. Typically the HBL and EBL have the appropriate energy levels to provide an efficient good extraction of the charge carriers from the photoactive layer and block the injection from the opposite charge carriers from the photoactive layer into the HBL and EBL at the same time.

ETL side hole blocking layer (HBL): This layer has a low HOMO, more negative than the HOMO of the photoactive layer, such that holes from the photo active layer cannot be efficiently injected into the HBL, i.e. holes from the photoactive layer are blocked. This layer may preferably have a LUMO such that the electrons are easily transferred from the photoactive layer to the ETL. In many cases, a suitable material for HBL, which blocks holes from the photoactive layer and at the same time does not hinder electron injection, is not available. In this case a buffer layer can be used instead, which does not fulfill all the requirements of an HBL. An example is a BPhen commonly used as a buffer between a C60 layer, which is part of the photoactive layer, and the cathode. Another example is the use of an undoped HTL (or ETL) between the photoactive layer and the doped HTL (or ETL).

Electron Transport layer (ETL): Same as for an OLED

Cathode side electron injection layer: Same as for an OLED

Top electrode (Cathode): Same as for an OLED

The characteristic features of two or more layers can be combined in a single layer if the materials fulfil the requirements. In some cases, layers can be omitted. For instance, EBL layers are not always used. The OSC can comprise polymer layers and for instance it can be a single polymer layer. The polymer layer can comprise polymer and smell molecules.

The OSC of the invention is stacked in tandem or multiple OSCs separated by the ICR in the following manner:

Substrate/Electrode/OSC/ICR/ . . . /OSC/Electrode where the optional HTL, ETL, and injection layers can be added. The " . . . " refers to a sequence of OSC/ICR, which can be repeated from 0 to 50 times. The stacked OSC can also comprise hybrid polymer and small molecule layers.

An example of a tandem organic solar cell can be constructed using vapor deposition technique in the following sequence:

1. A glass substrate (201) coated with a 90 nm layer of indium-tin oxide (ITO) (202) as anode—was sequentially ultrasonicated in a commercial detergent, rinsed in deionized water and exposed to oxygen plasma for about 1 min.
2. A 25 nm hole transport layer (collapsed layers 203 and 204) of hole-transporting N4,N4'-diphenyl-N4,N4'-dim-tolylbiphenyl-4,4'-diamine and including 5.0% of TCNQ-7 is deposited.
3. A 5 nm thick N4,N4'-diphenyl-N4,N4'-dim-tolylbiphenyl-4,4'-diamine layer (205)
4. A 20 nm thick mixture of ZnPc and C60 with molar ratio 1:1 (206) is deposited.
5. An HBL is not used in this case, instead of layer (207) a 5 nm layer of C60 is deposited, which in this case does not fulfill all the requirements for an HBL but serves as a buffer between layer (206) and the doped layer (208)
6. A 10 nm thick C60 (208) layer is deposited, doped with 5.0% of NDR-2.
7. A 5 nm thick ZnPc (209) layer is deposited
8. A 25 nm thick N4,N4'-diphenyl-N4,N4'-dim-tolylbiphenyl-4,4'-diamine (210) layer doped with 5.0% of TCNQ-7 is deposited.
9. A 5 nm thick N4,N4'-diphenyl-N4,N4'-dim-tolylbiphenyl-4,4'-diamine (211) layer is deposited
10. A 20 nm mixture of ZnPc and C60 with a molar ratio 1:2 (ZnPc:C60) (212) is deposited.
11. A 6 nm BPhen layer is used instead of layers 213, 214, and 215 is deposited. This BPhen layer, which in this case is not an ideal HBL serves as a buffer between layer (212) and cathode (216)
12. A 100 nm Aluminum cathode is deposited.

Embodiments of the invention can provide EL devices that have good luminance efficiency, good operational stability, and reduced drive voltages. Embodiments of the invention can also give reduced voltage rises over the lifetime of the devices and can be produced with high reproducibility and consistency to provide good light efficiency. They can have lower power consumption requirements and, when used with a battery, provide longer battery lifetimes.

The invention and its advantages are further illustrated by the specific examples that follow. The term "percentage" or "percent" and the symbol "%" indicate the volume percent (or a thickness ratio as measured on a thin film thickness monitor) of a particular first or second compound of the total material in the layer of the invention and other components of the devices. If more than one second compound is present, the total volume of the second compounds can also be expressed as a percentage of the total material in the layer of the invention.

Experimental Results

A list of additional materials used in the following experiments is as follows:

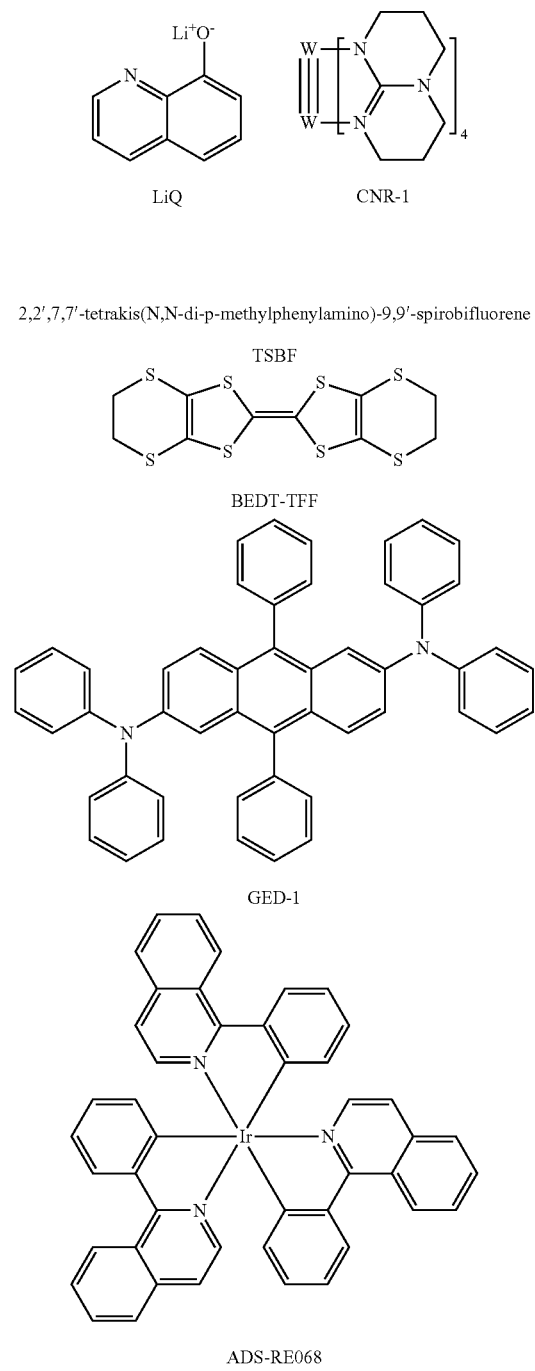

-continued
Zr 4-Hydroxyquinoxalate

CET-1

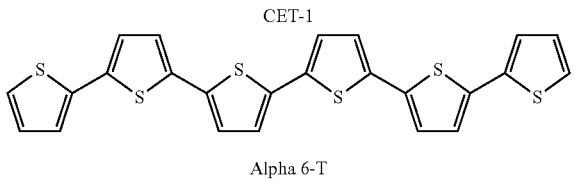

Alpha 6-T

LUMO and Effective HOMO Values

The following is a list of LUMO values (determined as previously discussed) for selected materials useful in the IL or p-DOL:

TABLE 1

| LUMO Values for p-DOL/IL Materials | |
|---|---|
| Compound | LUMO (eV) |
| CuPC | −3.2[1] |
| MgPC | −3.3 |
| AlQ$_3$ | −2.5 |
| LiQ | −3.2 |
| NAH-1 | −2.5 |
| NPB | >−2.4 |
| TSBF | −1.63 |
| NPH-5 | −2.62 |
| HAT-1 | −5.24[2] |
| TCNQ-7 | −5.04 |
| Pr-2 | −4.91 |
| PR-1 | −5.05 |
| Pr-4 | −4.82 |
| Pr-5 | −4.89 |
| Pr-6 | −4.94 |
| TCNQ-1 | −5.0 |

[1] See Chasse et al, J. Appl. Phys., 85, 6589 (1999). Note that Yan et al, Appl. Physics Letters, 79(25), 4148 (2001) reports a value of −3.7 eV, which is believed to be incorrect.
[2] See US2009015150

The following is a list of effective HOMO values (determined as previously discussed) for selected materials useful in the IL or p-DOL:

TABLE 2

| Effective HOMO Values for n-DOL Materials | |
|---|---|
| Compound | Effective HOMO (eV) |
| NDR-1 | −2.5 |
| NDR-2 | −2.5 to −2.6 |
| NDR-3 | −2.7 |
| NDR-4 | −3.3 |
| NDR-5 | −2.7 |
| CNR-1 | −2.55 |
| BEDT-TTF | −4.9[1] |

[1] Derived from Khodorkovskii et al, J. Mol. Elec., 5(1), 33-6 (1989)

Devices 1-1 to 1-6:

White tandem OLED devices were constructed using vapor deposition techniques in the following sequence:

1. A glass substrate coated with a 60 nm layer of indium-tin oxide (ITO) as the anode was sequentially ultrasonicated in a commercial detergent, rinsed in deionized water and exposed to oxygen plasma for about 1 min.
2. A 10 nm thick hole-injection layer (HIL) of a hole-injecting material HAT-1 was then deposited.
3. A 150 nm hole transport layer (HTL1) of hole-transporting material 4,4'-Bis[N-(1-naphthyl)-N-phenylamino]biphenyl (NPB) was then deposited.
4. A 30 nm thick blue light-emitting layer (BLEL) corresponding to the host material 9-(1-naphthyl)-10-(2-naphthyl)anthracene and including 5.0% of light-emitting material FD-53 was then deposited.
5. A 5 nm thick electron transporting layer (ETL1) of NFH-8 was then deposited.
6. A 35 nm thick n-doped organic layer (n-DOL) of 90% NPH-5 host and 10% NDR-2 as n-dopant was then deposited.
7. A 5 nm thick intermediate layer (IL) third layer as per Table 1 was then deposited.
8. A 10 nm thick p-doped organic layer (p-DOL) of 97% NPB host and 3% PR-1 was then deposited.
9. A second 10 nm thick hole transport layer (HTL2) of hole-transporting material 4,4'-Bis[N-(1-naphthyl)-N-phenylamino]biphenyl (NPB) was then deposited
10. A 20 nm thick red-orange light-emitting layer (RLEL) corresponding to host material NPB and including 3% of light-emitting material FD-46 was then deposited.
11. A 40 nm thick green light-emitting layer (GLEL) corresponding to the host material 2-phenyl-bis-9,10-(2-naphthyl)anthracene and including 5.0% of light-emitting material GED-1 was then deposited.
12. A 5 nm thick second electron transporting layer (ETL2) of NFH-8 then deposited.
13. A 29 nm thick electron injection layer (EIL) of 49% LiQ and 49% NPH-1 (Bphen) doped with 2% Li was then deposited.
14. A cathode of 100 nm aluminum was then deposited.

The above sequence completed the deposition of the EL device. Steps 3-5 constitute the first electroluminescent unit (EL1), steps 6-9 constitute the intermediate connector region (ICR) and steps 9-12 constitute the second electroluminescent unit (EL2). The device was then hermetically packaged in a dry glove box for protection against ambient environment. The devices thus formed were tested for operational voltage and color at an operating current density of 20 mA/cm$^2$ and the results are reported in Table 1 in the form of voltage (V), efficiency (cd/A and Lm/W) and CIE (Commission Internationale de L'Eclairage) coordinates. $T_{50}$ is the time (in hours) required for the luminance to drop by 50% of the original value at 80 mA/cm$^2$. $V_{rise}$ in the change in voltage after 50 hours at 80 mA/cm$^2$.

TABLE 1

Effect of IL between n-DOL and p-DOL

| Example | IL | V | Cd/A | Lm/W | CIE$_{x,y}$ | T$_{50}$ | V$_{rise}$ |
|---|---|---|---|---|---|---|---|
| 1-1 (Comp) | None | 11.0 | 31.7 | 9.0 | 0.284, 0.280 | 15 | 7.0 |
| 1-2 (Inv) | CuPC | 7.9 | 33.7 | 13.3 | 0.276, 0.298 | 220 | 0.7 |
| 1-3 (Inv) | HAT-1 | 8.2 | 36.5 | 13.7 | 0.280, 0.302 | 220 | 2.8 |
| 1-4 (Comp) | Alq | 9.7 | 35.1 | 11.4 | 0.281, 0.304 | 200 | 1.2 |
| 1-5 (Comp) | NAH-1 | 9.6 | 34.6 | 11.3 | 0.282, 0.293 | 140 | 5.7 |
| 1-6 (Comp) | Al (1 nm) | 8.3 | 30.5 | 11.5 | 0.277, 0.286 | 220 | 0.7 |

These results demonstrate that in the inventive format, the use of CuPC (example 1-2) or HAT-1 (example 1-3) in IL of the ICR provides unexpected improvements in overall performance relative to metals such as Al (example 1-6), other metal complexes (example 1-4) or an organic material with a LUMO that is not less negative than −3.0 eV (example 1-5).
Devices 2-1 to 2-2:
White tandem OLED devices were constructed exactly as described above for example 1-2 (CuPC in the IL of step 7) except that Alq was substituted for NPH-5 in the n-DOL of step according to Table 2.

TABLE 2

Effect of Host in n-DOL

| Example | n-DOL Host | V | Cd/A | Lm/W | CIE$_{x,y}$ | T$_{50}$ | V$_{rise}$ |
|---|---|---|---|---|---|---|---|
| 1-1 (Comp) | NPH-5 | 11.0 | 31.7 | 9.0 | 0.284, 0.280 | 15 | 7.0 |
| 1-2 (Inv) | NPH-5 | 7.9 | 33.7 | 13.3 | 0.276, 0.298 | 220 | 0.7 |
| 2-1 (Inv) | Alq | 8.6 | 33.0 | 12.0 | 0.280, 0.320 | 280 | 2.7 |
| 2-2 (Inv) | Alq:PH-5 1:1 | 8.3 | 35.1 | 12.5 | 0.281, 0.320 | 230 | 2.4 |

These results demonstrate that the host of the n-DOL is not critical and that the advantages seen with CuPC in the IL are maintained. For Alq as the host, some improvement in stability can be observed.
Devices 3-1 to 3-6:
White tandem OLED devices were constructed as described for devices 1-1 to 1-6 for steps 1-5 and 9-14. The ICR of steps 6-8 were modified according to Table 3. n-Mix1 is 49% LiQ and 49% Bphen doped with 2% Lithium (non-inventive n-DOL); n-Mix2 is 90% NPH-5 and 10% NDR-2; and p-Mix1 is 97% NPB and 3% PR-1.

TABLE 3

ICR Modifications

| Example | ICR | V | Cd/A | CIE$_{x,y}$ | T$_{50}$ | V$_{rise}$ |
|---|---|---|---|---|---|---|
| 3-1 (Comp) | 10 HAT-1 No IL 10 NPB | 7.5 | 32.4 | 0.290, 0.310 | 150 | 0.6 |
| 3-2 (Comp) | 10 HAT-1 5 CuPc 10 NPB | 7.4 | 31.7 | 0.280, 0.300 | 200 | 0.6 |
| 3-3 (Comp) | 10 p-Mix1 No IL 36 n-Mix1 | 8.6 | 33.3 | 0.290, 0.310 | 160 | 0.9 |
| 3-4 (Comp) | 10 p-Mix1 5 CuPc 36 n-Mix1 | 8.8 | 29.0 | 0.280, 0.290 | 150 | 0.8 |
| 3-5 (Comp) | 10 HAT-1 No IL 36 n-Mix2 | 8.7 | 32.8 | 0.290, 0.290 | 190 | 3.1 |
| 3-6 (Inv) | 10 HAT-1 5 CuPc 36 n-Mix2 | 8.1 | 33.2 | 0.280, 0.300 | 190 | 1.2 |
| 1-2 (Inv) (Table 1) | 10 p-Mix1 5 CuPc 35 n-Mix2 | 7.9 | 33.7 | 0.276, 0.298 | 220 | 0.7 |

Comparison of examples 3-2 to 3-1 show no effect of adding an inventive IL between layers of non-doped p-type and n-type (undoped) organic layers. Similarly, comparison of 3-4 to 3-3 shows no effect of adding the inventive interlayer when the n-DOL is non-inventive. However, use of an inventive IL when the n-DOL is inventive (compare 3-6 to 3-5) does provide an improvement in voltage, efficiency and voltage rise. Further comparison of inventive example 1-2 (Table 1) to inventive example of 3-6 shows an even larger improvement using a p-doped type layer relative to an undoped p-type layer.
Devices 4-1 to 4-12:
White tandem OLED devices were constructed using vapor deposition techniques in the following sequence:
1. A glass substrate coated with a 60 nm layer of indium-tin oxide (ITO) as the anode was sequentially ultrasonicated in a commercial detergent, rinsed in deionized water and exposed to oxygen plasma for about 1 min.
2. A 10 nm thick hole-injection layer (HIL) of a hole-injecting material HAT-1 was then deposited.

3. A 150 nm hole transport layer (HTL1) of hole-transporting material 4,4'-Bis[N-(1-naphthyl)-N-phenylamino]biphenyl (NPB) was then deposited.
4. A 30 nm thick blue light-emitting layer (BLEL) corresponding to the host material 9-(1-naphthyl)-10-(2-naphthyl)anthracene and including 5.0% of light-emitting material FD-53 was then deposited.
5. A 5 nm thick electron transporting layer (ETL1) of NFH-8 was then deposited.
6. A 35 nm thick n-doped organic layer (n-DOL) as per Table 4 as n-dopant was then deposited.
7. A 5 nm thick intermediate layer (IL) third layer as per Table 4 was then deposited. For example 4-8, the thickness of this layer was 15 nm.
8. A 10 nm thick p-doped organic layer (p-DOL) as per Table 4 was then deposited. For examples 4-7 and 4-8, this layer was eliminated.
9. A second 6 nm thick hole transport layer (HTL2) of hole-transporting material 4,4'-Bis[N-(1-naphthyl)-N-phenylamino]biphenyl (NPB) was then deposited
10. A 20 nm thick red-orange light-emitting layer (RLEL) corresponding to host material NPB and including 3% of light-emitting material FD-46 was then deposited.
11. A 40 nm thick green light-emitting layer (GLEL) corresponding to the host material 2-phenyl-bis-9,10-(2-naphthyl)anthracene and including 5.0% of light-emitting material GED-1 was then deposited.
12. A 5 nm thick second electron transporting layer (ETL2) of NFH-8 then deposited.
13. A 29 nm thick electron injection layer (EIL) of 90% NPH-5 and 10% NDR-2 was then deposited.
14. A cathode of 100 nm aluminum was then deposited.

The above sequence completed the deposition of the EL device. Steps 3-5 constitute the first electroluminescent unit (EL1), steps 6-9 constitute the intermediate connector region (ICR) and steps 9-12 constitute the second electroluminescent unit (EL2). The device was then hermetically packaged in a dry glove box for protection against ambient environment. The devices thus formed were tested for operational voltage and color at an operating current density of 20 mA/cm$^2$ and the results are reported in Table 4 in the form of voltage (V), efficiency (cd/A) and CIE (Commission Internationale de L'Eclairage) coordinates.

TABLE 4

Effect of n-DOL and p-DOL Variations +/− CuPC in IL

| Example | n-DOL | IL | p-DOL | V | Cd/A | CIE$_{x,y}$ | T$_{50}$ | V$_{rise}$ |
|---|---|---|---|---|---|---|---|---|
| 4-1 (Comp) | 90% NPH-5 + 10% NDR-2 | None | 97% NPB + 3% PR-1 | 11.2 | 33.3 | 0.27 0.29 | 15 | 6.0 |
| 4-2 (Inv) | 90% NPH-5 + 10% NDR-2 | CuPC | 97% NPB + 3% PR-1 | 8.3 | 33.6 | 0.26 0.30 | 160 | 0.7 |
| 4-3 (Comp) | 90% NPH-5 + 10% CNR-1 | None | 97% NPB + 3% PR-1 | 8.3 | 30.2 | 0.27 0.29 | 175 | 0.6 |
| 4-4 (Comp) | 90% NPH-5 + 10% CNR-1 | CuPC | 97% NPB + 3% PR-1 | 8.5 | 29.1 | 0.26 0.30 | 175 | 0.6 |
| 4-5 (Comp) | 90% NPH-5 + 10% BEDT-TTF | None | 97% NPB + 3% PR-1 | 20.9 | 22.7 | 0.44 0.49 | 1.5 | 3.5 |
| 4-6 (Comp) | 90% NPH-5 + 10% BEDT-TTF | CuPC | 97% NPB + 3% PR-1 | 24.0 | 20.53 | 0.45 0.51 | 2.5 | 2.0 |
| 4-7 (Comp) | 90% NPH-5 + 10% NDR-2 | CuPC (thin) | None | 14.2 | 8.0 | 0.14 0.12 | 75 | 0.8 |
| 4-8 (Comp) | 90% NPH-5 + 10% NDR-2 | CuPC (thick) | None | 15.1 | 8.73 | 014 0.12 | 70 | 0.5 |
| 4-9 (Comp) | 90% Bphen + 10% NDR-2 | None | 97% NPB + 3% PR-1 | 14.9 | 8.5 | 0.14 0.14 | 4 | 2.5 |
| 4-10 (Inv) | 90% Bphen + 10% NDR-2 | CuPC | 97% NPB + 3% PR-1 | 12.2 | 31.8 | 0.28 0.33 | 120 | 1.0 |
| 4-11 (Inv) | 90% Alq + 10% NDR-2 | None | 97% NPB + 3% PR-1 | 11.3 | 31.5 | 0.28 0.30 | 40 | 10 |
| 4-12 (Inv) | 90% Alq + 10% NDR-2 | CuPC | 97% NPB + 3% PR-1 | 8.7 | 30.5 | 0.27 0.31 | 250 | 2.5 |

The results in Table 4 show that a large improvement in performance is found with the use of a CuPC interlayer with the inventive n-dopant (compare 4-2 vs. 4-1) but not with other organic n-dopants (compare 4-4 vs. 4-3 or 4-6 vs. 4-5). The benefit is also seen with other hosts in the n-DOL (compare 4-10 vs. 4-9 and 4-12 vs. 4-11). Examples 4-7 and 4-8 show that a p-DOL is necessary for an effective connector layer. CuPC is known as a p-type material. Moreover, example 4-8 with a thicker IL of 15 nm CuPC (a material known to have p-type properties) could be considered equivalent to having an IL of 5 nm CuPC and a p-type layer of 10 nm CuPC. However, no improvements are observed in example 4-8.

Devices 5-1 to 5-14:

The following represent pn-junction devices. The architecture of the device is chosen such that a current flow can only occur if a reverse bias is applied, i.e. if the pn-junction is driven in the generating mode. For the normal operating bias, i.e. ITO as anode and Aluminium as cathode the injection barriers for the holes from the ITO into a hole blocking material and for the electrons from Aluminum into the electron blocking layer are so high that only small currents are flowing. Model devices with an ICR were constructed using vapor deposition techniques in the following sequence:

1. A glass substrate coated with a 90 nm layer of indium-tin oxide (ITO) as the anode was sequentially washed with N-methylpyrrolidinone, de-ionized water, acetone and de-ionized water followed by an UV ozone treatment.
2. A hole blocking layer (HBL) of NPH-5 was then deposited. The thickness was as indicated in Table 5.
3. A 50 nm thick n-doped organic layer (n-DOL) of 90% NPH-5 and 10% NDR-2 as n-dopant was then deposited.
4. A 5 nm thick intermediate layer (IL) third layer as per Table 5 was then deposited.
5. A 50 nm thick p-doped organic layer (p-DOL) of 97% NPB and 3% PR-1 as p-dopant was then deposited. The thickness was as indicated in Table 5
6. An electron blocking layer (EBL) of 4,4'-Bis[N-(1-naphthyl)-N-phenylamino]biphenyl (NPB) was then deposited.
7. An anode of 100 nm aluminum was then deposited.

The above sequence completed the deposition of the EL device. Steps 3-5 constitute the intermediate connector region (ICR). The device was then hermetically packaged in a dry glove box for protection against ambient environment. The devices thus formed were tested for operational voltage $V^1$ at an operating current density at 1 mA/cm$^3$ or $V^2$ at 10 mA/cm$^3$. In Table 5, $V_{rise}$ is measured as the slope of the Voltage-Time curve after 100 hours at 40 mA/cm$^2$.

TABLE 5

Effect of Interlayer Variations

| Example | HBL (nm) | EBL (nm) | IL | $V^1$ | $V^2$ | $V_{rise}$ (mV/h) |
|---|---|---|---|---|---|---|
| 5-1 (Inv) | 50 | 50 | CuPC | 3.71 | 4.75 | −0.011 |
| 5-2 (Comp) | 50 | 50 | ADS_RE068 | 4.35 | 6.12 | 0.030 |
| 5-3 (Inv) | 10 | 10 | CuPC | 2.62 | 3.22 | n.a. |
| 5-4 (Comp) | 10 | 10 | Pentacene | 2.85 | 3.88 | 0.024 |
| 5-5 (Inv) | 10 | 10 | HAT-1 | 2.82 | 3.43 | 3.099 |
| 5-6 (Comp) | 10 | 10 | NRH-2 | 7.54 | 9.83 | n.a. |
| 5-7 (Inv) | 10 | 10 | CuPC | 3.23 | 3.90 | −0.054 |
| 5-8 (Comp) | 10 | 10 | Rubrene | 3.45 | 4.21 | 0.026 |
| 5-9 (Comp) | 10 | 10 | CET-1 | 4.01 | 4.98 | 0.018 |
| 5-10 (Comp) | 10 | 10 | Alpha-6T | 3.80 | 4.55 | −0.045 |
| 5-11 (Comp) | 50 | 50 | Pentacene | 4.13 | 5.30 | 3.068 (85° C.) |
| 5-12 (Comp) | 50 | 50 | CET-1 | 4.26 | 5.04 | 1.108 (85° C.) |
| 5-13 (Comp) | 50 | 50 | Rubrene | 4.92 | 6.05 | Broken (85° C.) |
| 5-14 (Comp) | 50 | 50 | Alpha-6T | 4.48 | 5.35 | Broken (85° C.) |

The results in Table 5 show that in a non-emissive electronic device that the use of CuPC, an inventive material, in the IL of the ICR provides improved voltage and $V_{rise}$ compared to other materials with LUMOs less negative than −3.0 eV.

Devices 6-1 to 6-12:

Similar to devices 5-1 to 5-14, devices with an ICR were constructed using vapor deposition techniques in the following sequence:

1. A glass substrate coated with a 90 nm layer of indium-tin oxide (ITO) as the anode was sequentially washed with N-methylpyrrolidinone, de-ionized water, acetone and de-ionized water followed by an UV ozone treatment.
2. A 50 nm thick hole blocking layer (HBL) of NPH-5 was then deposited.
3. A 50 nm thick n-doped organic layer (n-DOL) was then deposited as indicated in Table 6.
4. A 5 nm thick intermediate layer (IL) third layer as per Table 6 was then deposited.
5. A 50 nm thick p-doped organic layer (p-DOL) was then deposited as indicated in Table 6.
6. A 50 nm thick electron blocking layer (EBL) of 4,4'-Bis[N-(1-naphthyl)-N-phenylamino]biphenyl (NPB) was then deposited.
7. An anode of 100 nm aluminum was then deposited.

The above sequence completed the deposition of the EL device. Steps 3-5 constitute the intermediate connector region (ICR). The device was then hermetically packaged in a dry glove box for protection against ambient environment. The devices thus formed were tested for operational voltage $V^1$ at an operating current density at 1 mA/cm$^3$ or $V^2$ at 10 mA/cm$^3$. In Table 6, V is measured at 1 mA/cm$^2$ and $V_{rise}$ is measured as the slope of the Voltage-Time curve after 100 hours at 40 mA/cm$^2$.

TABLE 6

Effect of n-DOL and p-DOL Variations +/− CuPC in IL

| Example | n-DOL | IL | p-DOL | V | $V_{rise}$ (mV/h) |
|---|---|---|---|---|---|
| 6-1 (Comp) | 92% NPH-5 + 8% CNR-1 | CuPC | 98.5% TSBF + 1.5% TCNQ-7 | 4.36 | n.a. |
| 6-2 (Comp) | 92% NPH-5 + 8% CNR-1 | None | 98.5% TSBF + 1.5% TCNQ-7 | 4.28 | 4.489 |
| 6-3 (Inv) | 92% NPH-5 + 10% NDR-2 | CuPC | 98.5% TSBF + 1.5% TCNQ-7 | 3.90 | 1.004 |
| 6-4 (Comp) | 92% NPH-5 + 10% NDR-2 | None | 98.5% TSBF + 1.5% TCNQ-7 | 8.65 | n.a. |
| 6-5 (Inv) | 92% NPH-5 + 10% NDR-2 | CuPC | 98.5% TSBF + 1.5% PR-1 | 4.17 | 0.020 |
| 6-6 (Comp) | 92% NPH-5 + 10% NDR-2 | None | 98.5% TSBF + 1.5% PR-1 | 7.55 | n.a. |
| 6-7 (Comp) | 90% CET-1 + 10% NDR-2 | CuPC | 97% NPB + 3% PR-1 | 2.43 | 0.051 |
| 6-8 (Comp) | 90% CET-1 + 10% NDR-2 | None | 97% NPB + 3% PR-1 | 2.48 | 0.169 |
| 6-9 (Inv) | 90% Alq + 10% NDR-2 | CuPC | 97% NPB + 3% PR-1 | 4.31 | 1.394 |
| 6-10 (Comp) | 90% Alq + 10% NDR-2 | None | 97% NPB + 3% PR-1 | 6.54 | 7.333 |
| 6-11 (Inv) | 90% NFH-8 + 10% NDR-2 | CuPC | 97% NPB + 3% PR-1 | 3.20 | 0.669 |
| 6-12 (Comp) | 90% NFH-8 + 10% NDR-2 | None | 97% NPB + 3% PR-1 | 4.26 | 8.003 |

The results in Table 6 show that, in a non-emissive electronic device, that the use of CuPC, an inventive material, in the IL with various p-DOL and n-DOL combinations provides improved voltage and $V_{rise}$.

The invention has been described in detail with particular reference to certain preferred embodiments thereof, but it will be understood that variations and modifications can be effected within the spirit and scope of the invention.

| PARTS LIST | |
|---|---|
| 100 | Tandem OLED |
| 110 | Anode |
| 120.1 | $1^{st}$ Electroluminescent Unit |
| 120.2 | $2^{nd}$ Electroluminescent Unit |
| 120.N | $N^{th}$ Electroluminescent Unit |
| 120.(N-1) | $(N-1)^{th}$ Electroluminescent Unit |
| 130.1 | $1^{st}$ Intermediate Connector Region |
| 130.2 | $2^{nd}$ Intermediate Connector Region |
| 130.(N-1) | $(N-1)^{th}$ Intermediate Connector Region |
| 170 | Cathode |
| 180 | Voltage/Current Source |
| 190 | Electrical Connectors |
| 200 | Solar Cell Device |
| 201 | Substrate |
| 202 | Anode |
| 203 | Hole Injection Layer |
| 204 | Hole Transport Layer |
| 205 | Electron Blocking Layer |
| 206 | 1st Photoactive Layer |
| 207 | Hole Blocking Layer |
| 208 | n-Doped Organic Layer |
| 209 | Intermediate Layer |
| 210 | p-Type Organic Layer |
| 211 | Electron Transport Layer |
| 212 | $2^{nd}$ Photoactive Layer |
| 213 | Hole Blocking Layer |
| 214 | Electron Transport Layer |
| 215 | Electron Injection Layer |
| 216 | Cathode |
| 300 | Substrate |
| 301 | Anode |
| 320 | $1^{st}$ EL Unit |
| 340 | Intermediate Connector Region (ICR) |
| 330 | $2^{nd}$ EL Unit |
| 314 | Cathode |
| 302 | Hole injection layer ($1^{st}$ EL Unit) |
| 303 | Hole transport layer ($1^{st}$ EL Unit) |
| 304 | Blue light emitting layer ($1^{st}$ EL Unit) |
| 305 | Electron transport layer ($1^{st}$ EL Unit) |
| 306 | n-Type doped organic layer (ICR) |
| 307 | Intermediate layer (ICR) |
| 308 | Organic p-type layer (ICR) |
| 309 | Hole transport layer ($2^{nd}$ EL Unit) |
| 310 | Red light emitting layer ($2^{nd}$ EL Unit) |
| 311 | Green light emitting layer ($2^{nd}$ EL Unit) |
| 312 | Electron transport layer ($2^{nd}$ EL Unit) |
| 313 | Electron injection layer ($2^{nd}$ EL Unit) |
| 350 | Voltage/Current Source |
| 360 | Electrical Connectors |

The invention claimed is:

1. An electronic device comprising an anode and a cathode, between which there are at least two organic phototransducing units where the units are separated by an intermediate connecting region which comprises:

a) an organic p-type layer;

b) an intermediate layer in direct contact with the organic p-type layer consisting essentially of a single compound that has a LUMO more negative than −3.0 eV and is different from an organic compound in the organic p-type layer; and c) an organic n-type doped layer in direct contact with the intermediate layer and including an electron transport material as a host and an organic n-dopant with an effective HOMO less negative than −4.5 eV.

2. The device of claim 1 wherein the organic n-dopant has an effective HOMO less negative than −3.5 eV.

3. The device of claim 1 wherein the n-dopant is selected from 2,2'-Diisopropyl -1,1',3,3'-tetramethyl-2,2',3,3',4,4',5,5',6,6',7,7'-dodecahydro-2,2'-bibenzo [d]imidazole (NDR-1); 4,4',5,5'-Tetracyclohexyl-1,1',2,2',3,3'-hexamethyl-2,2',3,3'-tetrahydro -2,2'-biimidazole (NDR-2); 2,2'-diisopropyl-4,4',5,5'-tetrakis(2-methoxyphenyl)-1,1',3,3'-tetramethyl-2,2',3,3'-tetrahydro-1H,1'H-2,2'-biimidazole (NDR-3); 2,2'-diisopropyl-1,1',3,3'-tetramethyl-2,2',3,3'-tetrahydro-1H,1'H-2,2'-bibenzo[d]imidazole (NDR-4);

2,2'-diisopropyl-4,4',5,5'-tetrakis(3-methoxyphenyl)-1,1',3,3'-tetramethyl-2,2',3,3'-tetrahydro-1H,1'H-2,2'-biimidazole (NDR-5); 2-Isopropyl-1,3-dimethyl-2,3,6,7-tetrahydro-5,8-dioxa-1,3-diaza -cyclopenta[b]naphthene; Bis-[1,3-dimethyl-2-isopropyl-1,2-dihydro-benzimidazolyl-(2)];

and 2,2'-Diisopropyl-4,5-bis (2-methoxyphenyl)-4',5'bis (4-methoxyphenyl)-1,1',3,3'-tetramethyl -2,2',3,3'tetrahydro-2,2'-biimidazole.

4. The device of claim 1 wherein the organic p-type layer is a p-type doped layer including an aromatic tertiary amine as a host and a p-type dopant with a LUMO more negative than −4.5 eV.

5. The device of claim 4 wherein the p-type dopant is chosen from hexaazatriphenylene compounds, fluorinated derivatives of tetracyanobenzoquinonedimethane or radialenes.

6. The device of claim 1 wherein the intermediate layer includes a metal phthalocyanine.

7. A tandem OLED comprising an anode and a cathode, between which there are at least two electroluminescent units where the units are separated by an intermediate connecting region which comprises:

a) an organic p-type layer;

b) an intermediate layer in direct contact with the organic p-type layer, consisting essentially of a single compound that has a LUMO more negative than −3.0 eV and is different from an organic compound in the organic p-type layer; and c) an organic n-type doped layer in direct contact with the intermediate layer and including an electron transport material as a host and an organic n-dopant with an effective HOMO less negative than −4.5 eV.

8. The tandem OLED of claim 7 wherein white light is emitted.

9. The tandem OLED of claim 7 wherein the organic p-type layer includes one or more compounds selected from the group consisting of 2,2'-(perfluorocyclohexa-2,5-diene-1,4-diylidene) dimalononitrile (TCNQ-1); N'-Dicyan-2,3,5,6-tetrafluoro-1,4-chinondiimine; N,N'-Dicyan-2,5-dichloro-1,4-chinondiimine; N,N'-Dicyan-2,5-dichloro -3,6-difluoro-1,4-chinondiimine; N,N'-Dicyan-2,3,5,6,7,8-hexafluoro-1,4-naphthochinondiimine; 1,4,5,8-Tetrahydro-1,4,5,8-tetrathia-2,3,6,7-tetracyanoanthrachinone;

1,3,4,5,7,8-Hexafluoronaphtho-2,6-chinontetracyanomethane (TCNQ-7); 2,2'-(2,5-Dibrom-3,6-difluorcyclohexa -2,5-dien-1,4-diyliden)dimalononitrile; 4,4'-

(1E,1'E)-(2-cyano-3,6-difluoro-5-isocyanocyclohexa-2,5-diene-1,4-diylidene)bis(cyanomethan-1-yl-1-ylidene)bis(2,3,5,6-tetrafluorobenzonitrile); 2,2',2''-(Cyclopropan-1,2,3-triyliden)tris(2-(2,6-dichlor-3,5-difluor-4-(trifluormethyl)phenyl)acetonitrile); (2E,2'E,2''E)-2,2',2''-(cyclopropane-1,2,3-triylidene)tris(2-(perfluorophenyl) acetonitrile); 2,2',2''-(cyclopropane-1,2,3-triylidene)tris(2-(perfluorobiphenyl-4-yl) acetonitrile); 2,2',2''-(cyclopropane-1,2,3-triylidene)tris(2-(2,6-dichloro-3,5-difluoro-4-(trifluoromethyl) phenyl)-acetonitrile);and Benzeneacetonitrile, α,α',α''-1,2,3-cyclopropanetriylidenetris[4-cyano-2,3,5,6-tetrafluorol].

10. The tandem OLED of claim 7 wherein the electron transporting material as a host in the organic n-type doped layer is chosen from metal oxinoids, anthracenes, rubrenes, fluoranthenes or phenanthrolines.

11. The tandem OLED of claim 7 wherein the organic p-type layer consists essentially of a hexaaztriphenylene compound.

12. The tandem OLED of claim 7 wherein the organic p-type layer is an organic p-type doped layer including an aromatic tertiary amine as a host and a p-dopant with a LUMO more negative than −4.5 eV.

13. The tandem OLED of claim 12 wherein the p-dopant is chosen from hexaazatriphenylene compounds, fluorinated derivatives of cyanobenzoquinonedimethanes or radialenes.

14. The tandem OLED of claim 12 wherein p-dopant in the p-type doped layer is chosen from fluorinated derivatives of tetracyanobenzoquinonedimethane or radialenes and the intermediate layer consists essentially of a hexaazatriphenylene compound.

15. The tandem OLED of claim 14 wherein the hexaazatriphenylene compound in the intermediate layer is:

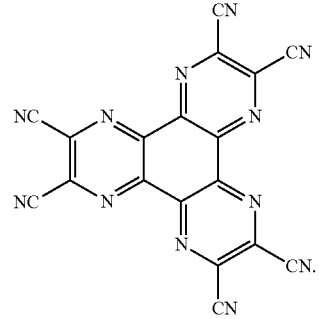

HAT-1

16. The tandem OLED of claim 7 wherein the intermediate layer includes a metal phthalocyanine.

17. The tandem OLED of claim 16 wherein the metal phthalocyanine is copper phthalocyanine.

18. A solar cell comprising an anode and a cathode, between which there are at least two organic photoactive units where the units are separated by an intermediate connecting region which comprises:
   a) an organic p-type layer;
   b) an intermediate layer in direct contact with the organic p-type layer consisting essentially of a single compound that has a LUMO more negative than −3.0 eV and is different from an organic compound in the organic p-type layer; and
   c) an organic n-type doped layer in direct contact with the intermediate layer and including an electron transport material as a host and an organic n-dopant with an effective HOMO less negative than −4.5 eV.

* * * * *